United States Patent [19]

Yabuki et al.

[11] Patent Number: 5,587,690
[45] Date of Patent: Dec. 24, 1996

[54] RING RESONATOR OSCILLATOR USABLE IN FREQUENCY SYNTHESIZERS AND COMMUNICATION APPARATUS

[75] Inventors: Hiroyuki Yabuki, Kawasaki; Morikazu Sagawa, Tokyo; Mitsuo Makimoto, Yokohama, all of Japan

[73] Assignee: Matsushita Electric Industrial Co., Ltd., Japan

[21] Appl. No.: 509,663

[22] Filed: Jul. 31, 1995

[30] Foreign Application Priority Data

Aug. 11, 1994 [JP] Japan ............................ 6-189499
Sep. 22, 1994 [JP] Japan ............................ 6-227923
Jan. 24, 1995 [JP] Japan ............................ 7-009085

[51] Int. Cl.[6] .......................... H03B 5/18; H30L 7/099
[52] U.S. Cl. ........................ 331/2; 331/9; 331/36 C; 331/46; 331/49; 331/76; 331/96; 455/76; 455/325
[58] Field of Search .......................... 331/96, 99, 100, 331/107 DP, 107 SL, 9, 2, 25, 36 C, 49, 46, 76, 117 D; 455/76, 325

[56] References Cited

U.S. PATENT DOCUMENTS

| | | | |
|---|---|---|---|
| 4,185,252 | 1/1980 | Gerlach | 331/56 |
| 4,749,963 | 6/1988 | Makimoto et al. | 331/99 |
| 5,289,139 | 2/1994 | Fiedziuszko et al. | 331/56 |

FOREIGN PATENT DOCUMENTS

| | | |
|---|---|---|
| 0527470 | 2/1993 | European Pat. Off. . |
| 0560497 | 9/1993 | European Pat. Off. . |
| 0573985 | 12/1993 | European Pat. Off. . |
| 0571777 | 12/1993 | European Pat. Off. . |
| 2631757 | 11/1989 | France . |

OTHER PUBLICATIONS

U. Tietze, CH. Schenk 'Halbleiter-Schaltungstechnik, 9. Auflage' 1990, Springer, Berlin, Heidelberg, New York.
"Nonlinear Design and Experimental Results of a Low–Noise Varactor Tunable Oscillator Using a Coupled Microstrip" by V. Gungerich et al; 1992 IEEE MTT–S Digest; pp. 549–552.
"20–40–GHz Push–Push Dielectric Resonator Oscillator" by Anthony M. Pavio et al; IEEE Transactions on Microwave Theory and Techniques, vol. MTT-33, No. 12, Dec., 1985; pp. 1346–1349.

*Primary Examiner*—Siegfried H. Grimm
*Attorney, Agent, or Firm*—Rossi & Associates

[57] ABSTRACT

A first oscillator includes: a ring resonator; an oscillation circuit having a negative resistance active circuit coupled to a first point on the ring resonator for oscillating at an oscillation frequency and resonating the resonator; an output terminal, coupled to a second point on the ring resonator where a voltage is substantially zero with respect to the predetermined frequency when the ring resonator resonates, for outputting a resonant frequency signal, wherein even order harmonic components are outputted with the fundamental component suppressed. A second oscillator includes a ring resonator having points A to D equidistantly dividing the ring resonator, first and second oscillation circuits coupled to the points A and B respectively, first and second grounding capacitors having capacitance equivalent to those of the first and second oscillation circuits. Thus, two independent oscillators which do not affect each other are provided with a single resonator. In the first and second oscillators, grounding capacitors, a resonant capacitor may be provided to miniaturize the oscillator. Variable capacitances may be provided to prevent the point from moving with a change in the controlled oscillation frequency. Frequency synthesizers and communication apparatus including the first or second oscillator are also disclosed.

46 Claims, 16 Drawing Sheets

$\theta_5 = 90°$ OF ELECTRICAL LENGTH AT $f_0$

RING RESONATOR OSCILLATOR USABLE IN FREQUENCY SYNTHESIZERS AND COMMUNICATION APPARATUS

BACKGROUND OF THE INVENTION

1. Field of the Invention

This invention relates to an oscillator and a frequency synthesizer and a communication apparatus using the oscillator.

2. Description of the Prior Art

There are two types of oscillators for oscillating at a high frequency band such as a quasi-microwave band or the like, namely, the first type of oscillator directly oscillates at the desired frequency and the second type of oscillator oscillates at a low frequency and a frequency up-converter coupled to the oscillator provides an up-converted frequency output. The second type of oscillator is frequently used due to easiness in designing and a reduction of a consumed current. Frequency synthesizer and communication apparatus using such a prior art oscillator are also known.

Hereinafter, a prior art high frequency band oscillator will be described.

FIG. 20 is a block diagram of the prior art high frequency band oscillator.

In FIG. 20, numeral 1 denotes a ring resonator, numeral 2 denotes an oscillation portion comprising a negative resistance active circuit using transistors or the like, and numeral 3 denotes a coupling capacitance for coupling between the ring resonator 1 and the oscillation portion 2. Numeral 5 denotes a frequency up-converter comprising non-linear elements such as transistors, numeral 6 denotes a bandpass filter (BPF) for outputting an up-converted frequency output of the frequency up-converter and attenuating unnecessary waves, numeral 7 is an output terminal, and point A is a coupling point between the ring resonator 1 and oscillation portion 2.

An operation of the prior art high frequency band oscillator having the structure mentioned above will be described.

At first, the oscillator 4 oscillates at a frequency determined by an electrical length of the ring resonator 1 and a circuit constant of the oscillation portion 2. Because the frequency up-converter 5 comprises non-liner elements such as transistors and has a function generating a higher harmonic wave of the input signal, a double frequency output is obtained from the output of the oscillator 4 by the frequency up-converter 5. However, since an output level of a basic wave is generally larger than that of the double frequency output, it is necessary that a BPF 6 for attenuating the basic waves is connected at a rear stage of the frequency up-converter 5. Therefore, the double frequency waves can be obtained from the output terminal 7.

On the other hand, a frequency synthesizer comprising the rink resonator, and the oscillation portion and a phase synchronizing circuit is known. In such a phase synchronizing circuit, it is necessary to divide the output of the oscillator into a signal for an input of a phase synchronizing circuit and another signal for the external output.

Such a prior art frequency synthesizer will be described more specifically.

FIG. 21 is a block diagram of a prior art frequency synthesizer.

In FIG. 21, since elements denoted by numerals 1 to 4 and 7 and the point A are the same as FIG. 20, the detailed description is omitted. Numeral 8 denotes a distributor for outputting distribution outputs with a isolation degree therebetween kept, numeral 9 denotes a phase synchronizing portion having a frequency divider, a phase comparator, and a charge pump or the like, and numeral 10 denotes a loop filter for feeding back an output of the phase synchronizing portion 9 with high frequency components removed. Numeral 11 is a reference signal generator, and numeral 12 denotes a phase synchronizing circuit comprising the phase synchronizing portion 9, the loop filter 10, and the reference signal generator 11.

An operation of this prior art frequency synthesizer will be described.

The output of the distributor 8 is phase-compared by the phase synchronizing portion 9 with the reference signal from the reference signal generator 11. The phase synchronizing portion 9 supplies a synchronizing signal to the oscillation portion 2 through the loop filter 10 with unnecessary high frequency component removed wherein the outputs of the distributor 8 should have a sufficient isolation degree.

However, the prior art oscillator shown in FIG. 20 has problems that the circuit scale becomes larger and the 5 consumed current becomes large because the frequency-up converter and the prior art frequency synthesizer shown in FIG. 21 have problems that the circuit scale is large and the consumed current is large because the distributor are necessary in addition to the oscillator.

SUMMARY OF THE INVENTION

The aim of the present invention is to provide an improved oscillator and an improved frequency synthesizer and an improved communication apparatus using the oscillator.

According to this invention, there is provided an oscillator comprising an oscillation portion, having a ring resonator and a negative resistance active circuit coupled to the ring resonator through a coupling capacitance, such that an oscillation output is obtained from a point on said ring resonator where a voltage is zero with respect to the oscillation frequency but a secondary harmonic frequency output is outputted thereat.

More specifically, the voltage output of the oscillator is maximum at the coupling point between the ring resonator and the oscillation portion and the ring resonator shows a sinusoidal distribution of voltages along the line of the ring resonator, so that the voltage at a certain point on the ring resonator is zero with respect to the fundamental oscillation frequency but is a maximum at the secondary harmonic frequency. Therefore, it is possible to obtain the secondary harmonic frequency output from this point and to suppress the fundamental harmonic component without a bandpass filter.

According to this invention there is provided a first oscillator comprising: a ring resonator; an oscillation circuit having a negative resistance active circuit coupled to a first point on the ring resonator for oscillating at an oscillation frequency and resonating the resonator; an output terminal, coupled to a second point on the ring resonator where a voltage is substantially zero with respect to the oscillation frequency when the ring resonator resonates, for outputting a resonant frequency signal, wherein even order harmonic components are outputted with the fundamental component suppressed.

According to this invention, there is provided a second oscillator comprises a ring resonator having points A to D equidistantly dividing the ring resonator, first and second oscillation circuits coupled to the points A and B respectively, first and second grounding capacitors having capacitance equivalent to those of the first and second oscillation circuits. Therefore, two independent oscillators which do not affect each other are provided with a single resonator. More specifically, the second oscillator comprising: a ring resonator having a predetermined line length; a first oscillation circuit having a first negative resistance active circuit coupled to a first point on the ring resonator for oscillating at a first oscillation frequency and resonating the resonator; a second oscillation circuit having a second negative resistance active circuit coupled to a second point on the ring resonator which is apart from the first point by a quarter of the predetermined line length for oscillating at a second oscillation frequency which is different from the first oscillation frequency and for resonating the resonator; a first grounding capacitor for coupling a third point on the ring resonator to the ground, the third point being apart from the first point by a half of the predetermined line length, the first grounding capacitor having a first capacitance equivalent to a capacitance of the first oscillation circuit viewed from the first point; a second grounding capacitor for coupling a fourth point on the ring resonator to the ground, the fourth point being apart from the second point by a half of the predetermined line length, the second grounding capacitor having a second capacitance equivalent to a capacitance of the second oscillation circuit viewed from the second point; and an outputting circuit for supplying first and second outputs from the third and fourth points respectively.

According to the invention, there is provided a third oscillator comprising: a ring resonator; an oscillation circuit having a negative resistance active circuit coupled to a first point on the ring resonator for oscillating at an oscillation frequency and resonating the resonator; and first and second output terminals, coupled to second and third points which are apart from the first point by the same line length along the ring resonator and are apart each other by an electrical length of 90° with respect to the oscillation frequency along the ring resonator, for outputting resonant frequency signals respectively.

In the first to third oscillators, grounding capacitors, a resonant capacitor may be further provided to miniaturize the oscillator. Variable capacitances may be provided to prevent the point from moving with a change in the controlled oscillation frequency. Frequency synthesizers and communication apparatus including the first to third oscillators are also provided.

The first oscillator may further comprise: a second output terminal, coupled to a third point where a voltage is substantially zero with respect to the oscillation frequency when the ring resonator resonates, for outputting a second resonant frequency signal which is in phase with the resonant frequency signal; and an in-phase combining circuit for combining the resonant frequency signal with the second resonant frequency signal.

The first oscillator may further comprise: a second output terminal, coupled to a third point where a voltage is substantially zero with respect to the oscillation frequency when the ring resonator resonates, for outputting a second resonant frequency signal which is in phase with the resonant frequency signal; a first grounding capacitor connected between the output terminal to the ground; a second grounding capacitor connected between the second output terminal to the ground, the first capacitor having a capacitance which is substantially equal to a capacitance of the second capacitor; and an in-phase combining circuit for combining the resonant frequency signal with the second resonant frequency signal and in addition, may comprise a variable capacitor, having a variable capacitance, connected between the first point and a fourth point which is apart from the first point by a half of a line length of the ring resonator of may further comprise: a first variable capacitor connected between the first point and the ground; and a second variable capacitor connected between a fourth point and the ground, the fourth point being apart from the first point by a half of a line length of the ring resonator, the first and second variable capacitors having substantially the same voltage-capacitance characteristic in order to perform a voltage controlled operation.

In each of these oscillators, the oscillation circuit has a control input for receiving a control signal and oscillates at the oscillation frequency controlled in accordance with the control signal.

According to this invention, there is provided a frequency synthesizer comprising: an oscillation portion having a ring resonator and an oscillation circuit including a negative resistance active circuit coupled to the ring resonator, the oscillation circuit being coupled to a first point of the resonator, resonating the ring resonator, and generating an oscillation signal of which frequency and phase are controlled in accordance with a control signal; a phase synchronizing circuit for generating the control signal by comparing a reference signal with the oscillation signal; and an output terminal for supplying a resonant frequency signal from a second point on the ring resonator. The modification similar to these oscillator as mentioned is also effected to the frequency synthesizer to miniaturize the oscillator.

The second oscillator may further comprise a switch for switching a supply power to either of the first or second oscillation circuit in accordance with a switch control signal.

In the second oscillator, the outputting circuit comprises first and second buffer amplifiers for amplifying outputs from the third and fourth points respectively and a combining circuit for combining outputs of the first and second buffer amplifiers.

According to this invention, there is provided a communication apparatus using the second oscillator wherein the first output is used for the local signal of transmission band and the second output is used for local signal of receiving band of a radio signal. According to this invention, there is provided a communication apparatus using the second oscillator wherein the first output is used in a first frequency converter for frequency converting of a received radio signal and the second output is used for second frequency converter for frequency converting of an output of the first frequency converter before detection processing.

According to this invention, there is provided a frequency synthesizer using the second oscillator, wherein the first and second oscillation circuits in the second oscillator in the frequency synthesizer have substantially the same frequency sensitivity such that the same change in the first and second control signals causes the same variation in the first and second oscillation frequencies.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

EMBODIMENT 1

Hereinbelow, a first embodiment of this invention will be described with reference to drawings.

Figure 1:
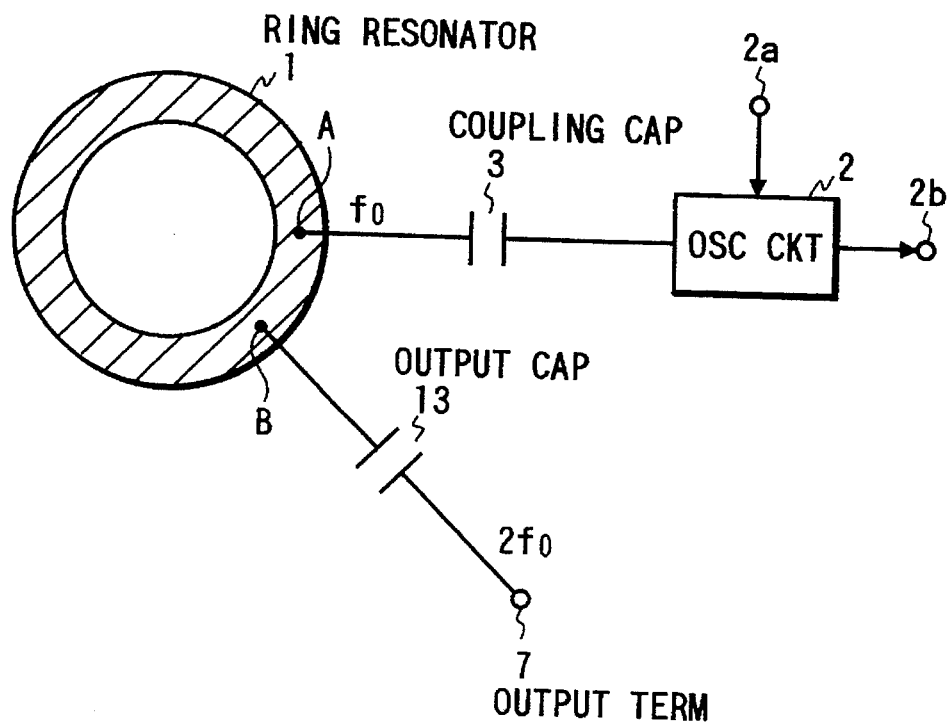
FIG. 1 is a schematic drawing of an oscillator of a first embodiment.
Figure 2:
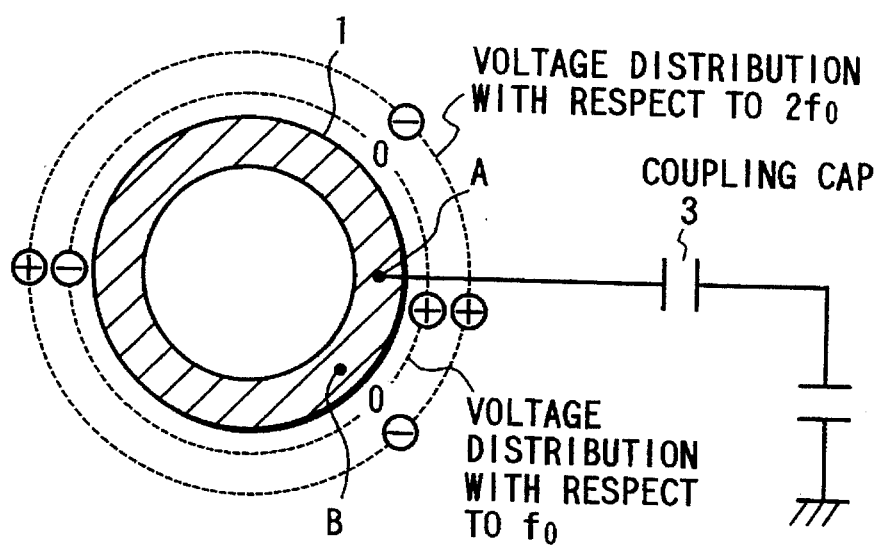
FIG. 2 is an illustration of a voltage distribution on a ring resonator shown in FIG. 1.

FIG. 1 is a schematic drawing of an oscillator of the first embodiment. FIG. 2 is an illustration of a voltage distribution on a ring resonator shown in FIG. 1. The oscillator of the first embodiment comprises a (dielectric) ring resonator 1, an oscillation circuit 2 for generating an oscillation signal having an oscillation (fundamental) frequency $f_0$, a coupling capacitor 3 for coupling the oscillation circuit 2 to the ring resonator 1 through a coupling point A on the ring resonator 1, and an output capacitor 13 for supplying a secondary harmonic frequency output (resonant signal) from a point B on the ring resonator 1 to an output terminal 7. The point B on the ring resonator 1 shows zero voltage with respect to the fundamental oscillation frequency $f_0$ but a maximum voltage with respect to the double frequency $2f_0$.

An operation of the oscillator having the structure mentioned above.

At first, the oscillation circuit 2 oscillates at the fundamental frequency $f_0$ determined by an electrical length of the ring resonator 1 and a circuit constant of the oscillation circuit 2 and the point A shows the maximum voltage with respect to the fundamental component frequency $f_0$ and a sinusoidal voltage distribution occurs with respect to the fundamental frequency $f_0$ as shown in FIG. 2. In this voltage distribution, there is a point B where the voltage is zero with respect to the fundamental frequency $f_0$ but is maximum with respect to the secondary harmonic frequency $2f_0$. The point B is apart from the coupling point A by a distance less than a quarter of the line length of the ring resonator 1. Therefore, the output capacitor 13 can output a resonant signal of the secondary harmonic frequency $2f_0$ with the fundamental frequency suppressed. That is, even order harmonic components are supplied with odd order components suppressed.

As mentioned above, according to this embodiment, a high frequency band oscillator is provided with a simple circuit structure and a low current consumption because a frequency-up converter which was conventionally connected to an output of the oscillator becomes unnecessary.

In this embodiment, the oscillation circuit 2 is used for resonating the ring resonator 1. However, the oscillation circuit 2 has a control input 2a for receiving a frequency control signal and can change the oscillation frequency in accordance with a voltage of the frequency control signal. If the oscillation circuit oscillates at a fixed frequency, a fixed voltage is supplied to the control input 2a. The oscillation circuit 2 has an oscillation signal output 2b for supplying an oscillation signal to a phase synchronizing circuit in a frequency synthesizer. Therefore, this oscillator can be used for frequency synthesizers wherein a voltage controlled oscillation is performed. However, these terminals 2a and 2b may be omitted in the specification except embodiment of the frequency synthesizer.

EMBODIMENT 2

Hereinbelow, a second embodiment of this invention will be described with reference to a drawing.

Figure 3:
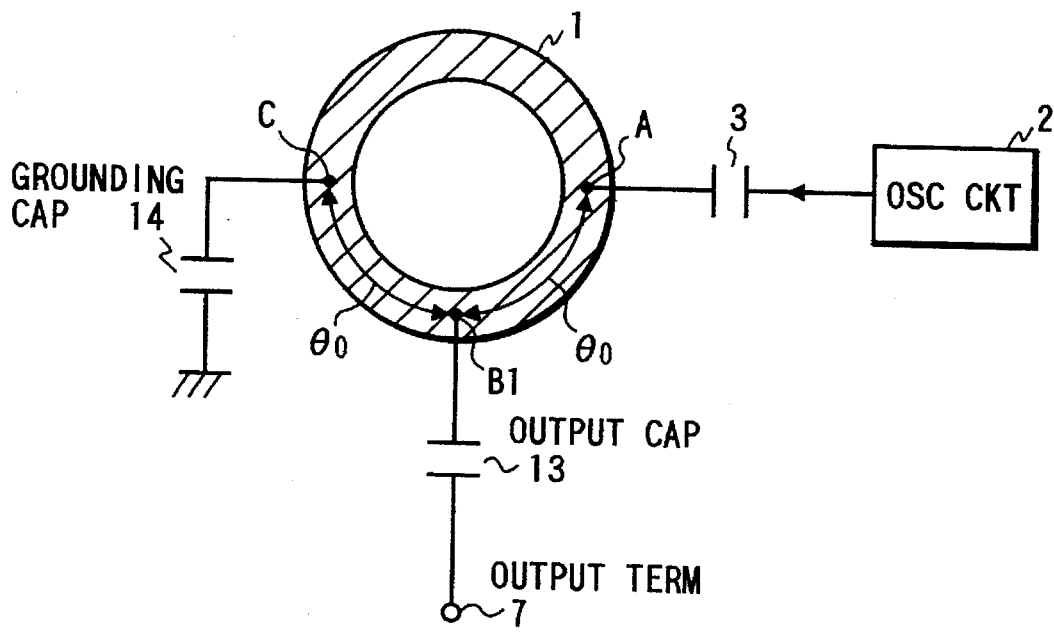
FIG. 3 is a schematic drawing of an oscillator of a second embodiment of this invention.

FIG. 3 is a schematic drawing of an oscillator of the second embodiment of this invention. The basic structure is similar to the first embodiment and the difference between first and second embodiments is in that a capacitor 14 coupled to the ground is provided at a point C apart from the coupling point A by a half of line length of the ring resonator 1.

An operation of the oscillator of the second embodiment will be described.

The basic operation is the same as the first embodiment. The difference is in that a position of the point B1 where the voltage with respect to the fundamental frequency $f_0$ is zero but the voltage is maximum with respect to the secondary harmonic frequency $2f_0$ can be controlled in accordance with the value of the capacitance for grounding provided at the point C. Particularly, if the capacitance value of the capacitor 14 for grounding is equivalent to a capacitance value of the oscillation portion 2 viewed from the point A of the ring resonator 1, the point B1 locates at a middle point between the points A and C on the ring resonator 1.

As mentioned above, according to this embodiment, a high frequency band oscillator is provided with a simple circuit structure and a low current consumption because a frequency up-converter which would be connected to an output of the oscillator is unnecessary by obtaining the output of the oscillator from the point A on the ring resonator where the voltage is zero with respect to the oscillation frequency as shown in FIG. 3.

EMBODIMENT 3

Hereinbelow a third embodiment of this invention will be described with reference to FIG. 4.

Figure 4:
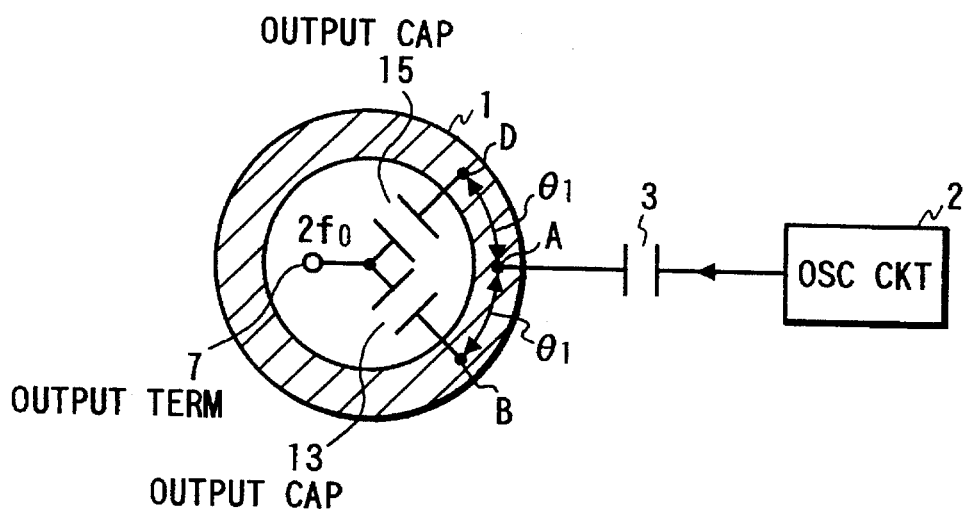
FIG. 4 is a schematic drawing of an oscillator of a third embodiment of this invention.

FIG. 4 is a schematic drawing of an oscillator of the third embodiment of this invention. The basic structure is similar to the first embodiment and the difference between first and third embodiment is in that outputs at two points B and D on the ring resonator where the voltages is zero with respect to the fundamental harmonic frequency f0 and are maximum with respect to the secondary frequency 2f0 are outputted through output capacitors 13 and 15 with the outputs in-phase combined.

An operation of the oscillator of the third embodiment will be described.

The basic operation is the same as the first embodiment. The difference is in that the positions of the points B and D show the maximum voltages with respect to the secondary harmonic frequency and a phase difference therebetween of 360°, that is, in-phase, so that the secondary harmonic component can be obtained with large intensity by in-phase combining through the output capacitors 13 and 15. That is, even order harmonic components can be obtained with larger intensity than the first embodiment. On the other hand, the fundamental component and the odd order harmonic components are suppressed similarly to the first embodiment.

As mentioned above, according to this embodiment, a high frequency band oscillator is provided with a simple circuit structure and a low current consumption because a frequency up-converter which would be connected to an output of the oscillator is unnecessary and a larger output level of the secondary harmonic component is provided from two points B and D on the ring resonator where the voltages are zero with respect to the oscillation frequency as shown in FIG. 4.

FIG. 4 shows only an example where output capacitors 13 and 15 are used as the in-phase combining means and other in-phase combining circuits can be used similarly.

EMBODIMENT 4

Hereinbelow a fourth embodiment of this invention will be described with reference to FIG. 5.

Figure 5:
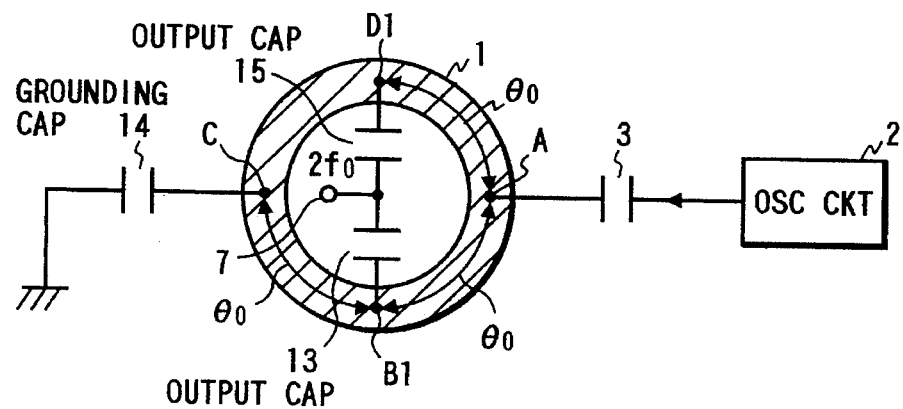
FIG. 5 is a schematic drawing of an oscillator of a fourth embodiment of this invention.

FIG. 5 is a schematic drawing of an oscillator of the fourth embodiment of this invention. The basic structure of the oscillator of the fourth embodiment is similar to the third embodiment and the difference between the fourth embodiment and the third embodiment is in that a grounding capacitor 14 is provided at a point C apart from the coupling point A by a half of the line length of the ring resonator 1.

An operation of the oscillator having the structure of the fourth embodiment will be described.

The basic operation is similar to the third embodiment. The difference is in that the positions of the points B1 and D1 where the voltages are zero with respect to the fundamental frequency f0 and are maximum with respect to the secondary harmonic frequency 2f0 can be controlled. Particularly, if a capacitance value of the grounding capacitor 14 is equivalent to the capacitance value of the oscillation circuit 2 viewed from the point A, these two points B1 and D1 are at middle points of points A and C on the ring resonator 1.

As mentioned above, according to this embodiment, a high frequency band oscillator is provided with a simple circuit structure and a low current consumption because a frequency up-converter which would be connected to an output of the oscillator is unnecessary and a larger output level of the double frequency signal is provided by obtaining the outputs of the oscillator from two points B1 and D1 on the ring resonator 1 where the voltages are zero with respect to the oscillation frequency through in-phase combining.

Moreover, FIG. 5 shows only an example of this embodiment. That is, the output capacitors 13 and 15 are used as the in-phase combining means. However, other in-phase combining circuits can used for this embodiment.

EMBODIMENT 5

Hereinbelow a fifth embodiment of this invention will be described with reference to drawings. The fifth embodiment is provided to miniaturize the ring resonator 1.

FIG. 8A is a schematic drawing of an oscillator of a first example of the fifth embodiment. The basic structure of the oscillator of this first example of the fifth embodiment is similar to the third embodiment and the difference between the first example of the fifth embodiment and the third embodiment is in that a resonant capacitor 16 is connected between the coupling point A and the coupling point C apart from the coupling point A by a half of the line length of the ring resonator 1 and grounding capacitors 17 and 18 having the same capacitance value are connected to two points B and D on the ring resonator 1 where the voltage is zero with respect to the fundamental frequency f0.

Figure 6A:
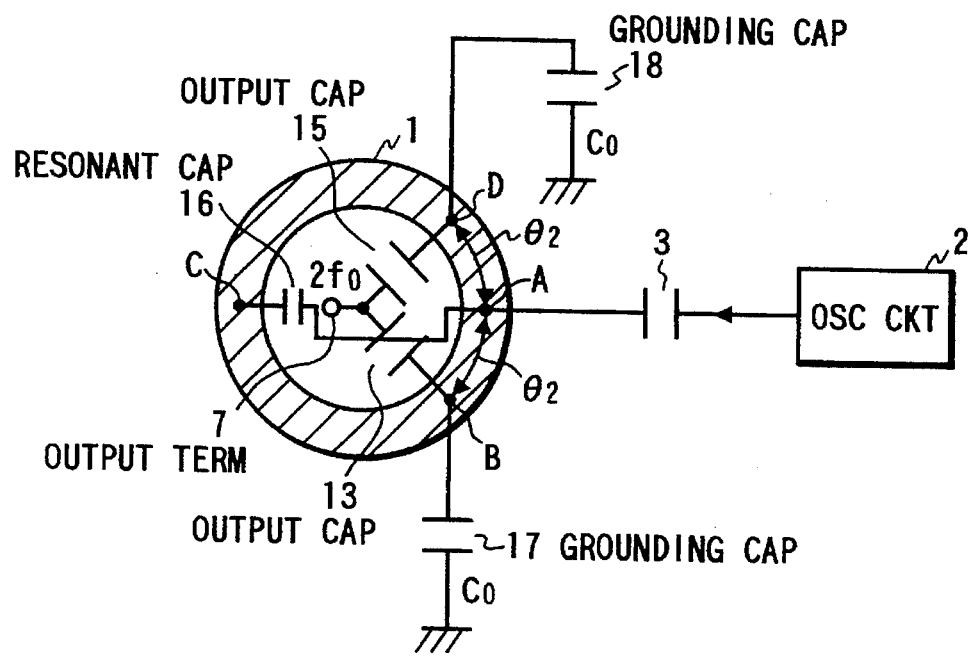
FIGS. 6A and 6B are schematic drawings of oscillators of first and second examples of a fifth embodiment.
Figure 6B:
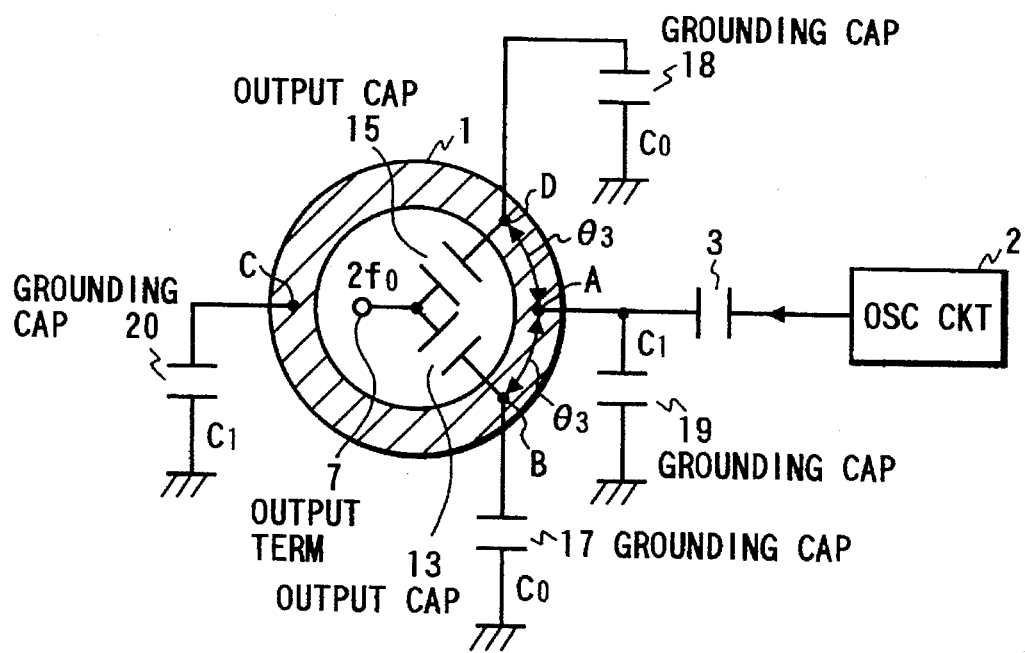

FIG. 6B is a schematic drawing of an oscillator of a second example of the fifth embodiment of this invention. The basic structure of this second example of the fifth embodiment is similar to the third embodiment and the difference between the second example of the fifth embodiment and the third embodiment is in that the coupling point A and the ground is coupled by a capacitor 19, the point C apart from the coupling point A by the half of the line length of the ring resonator 1 and the ground is coupled by a grounding capacitor 20 having the same capacitance value as the grounding capacitor 19, and capacitors 17 and 18 having the same capacitance value are connected between the ground and two points B and D on the ring resonator 1 where the voltage is zero with respect to the fundamental frequency f0. This structure provides that capacitances are symmetrically (with balance) provided with respect to the two points A and C where voltages are maximum with respect to the fundamental frequency f0.

Operations of the oscillator of the first and second examples of the fifth embodiment will be described.

An electrical length of the ring resonator 1 of fifth embodiment for providing the oscillation output having the same frequency f0 as the first to fourth embodiments is shorter than first to fourth embodiments because the oscillator oscillates at the frequency determined by the electrical length of the ring resonator 1, a circuit constant of the oscillation portion 2, and resonating capacitance 16 or the grounding capacitances 19 and 20. Therefore, the voltages at two points B and D on the ring resonator 1 is kept zero with respect to the fundamental frequency f0 but the frequency proving the maximum voltage is higher than the secondary harmonic frequency 2f0. Then, providing the grounding capacitors 17 and 18 at the two points B and D on the ring resonator 1 can control the frequency providing the maximum voltage at the two points B and D. In this case, because these points provide zero voltage with respect to the fundamental harmonic frequency f0, so that basic operation is unchanged.

That is, the maximum voltage at the secondary frequency 2f0 is provided by connecting the grounding capacitors 17 and 18, having the same suitable capacitance value, to the two points B and D on the ring resonator 1 and outputs at points B and D have a phase difference of 360°, that is, an in-phase relation, so that the secondary harmonic frequency signal having a larger intensity can be obtained than the first embodiment by the in-phase combining through the output capacitances 13 and 15. Further, the suppression of the fundamental harmonic component is the same as the first embodiment.

As mentioned above, according to this embodiment, a small-size high frequency band oscillator is provided with a simple circuit structure and a low current consumption because a frequency up-converter which would be connected to an output of the oscillator is unnecessary and a larger output level of the secondary harmonic component is provided by connecting the resonant capacitance 16 between the coupling point A and the point C apart from the coupling point A by the half of the line length of the ring resonator 1 and by connecting the grounding capacitances having the same value to two points B and D on the ring resonator 1 where the voltage is zero with respect to the fundamental frequency f0.

In this embodiment, the output capacitors 13 and 15 are used as the in-phase combining means. However, other in-phase combining circuits can be used for this embodiment. Further, the positions of the points B and D where the voltages are zero with respect to the fundamental harmonic frequency f0 and maximum with respect to the secondary harmonic frequency can be controlled by addition of the grounding capacitor to the point C on the ring resonator 1. Particularly, if a capacitance value of the grounding capacitor is equivalent to the capacitance value of the oscillation portion 2 viewed from the coupling point A, these two points B and D are at middle points of points A and C on the ring resonator.

EMBODIMENT 6

Hereinbelow a sixth embodiment of this invention will be described with reference to drawings.

Figure 7A:
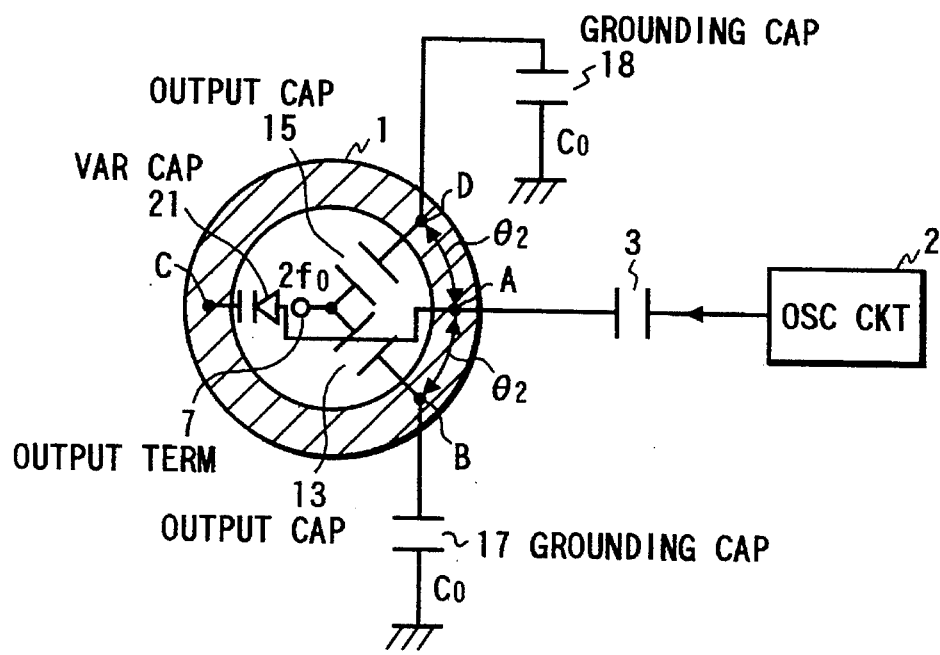
FIGS. 7A and 7B are schematic drawings of an oscillator of first and second examples of a sixth embodiment.

FIG. 7A is a schematic drawing of an oscillator of a first example of the sixth embodiment of this invention. The basic structure of the first example of the sixth embodiment is similar to the first example of the fifth embodiment shown in FIG. 6A and the difference is in that a variable capacitance 21 is used as the capacitor coupling the coupling point A to the point C which is apart from the coupling point A by the half of the line length of the ring resonator 1.

Figure 7B:
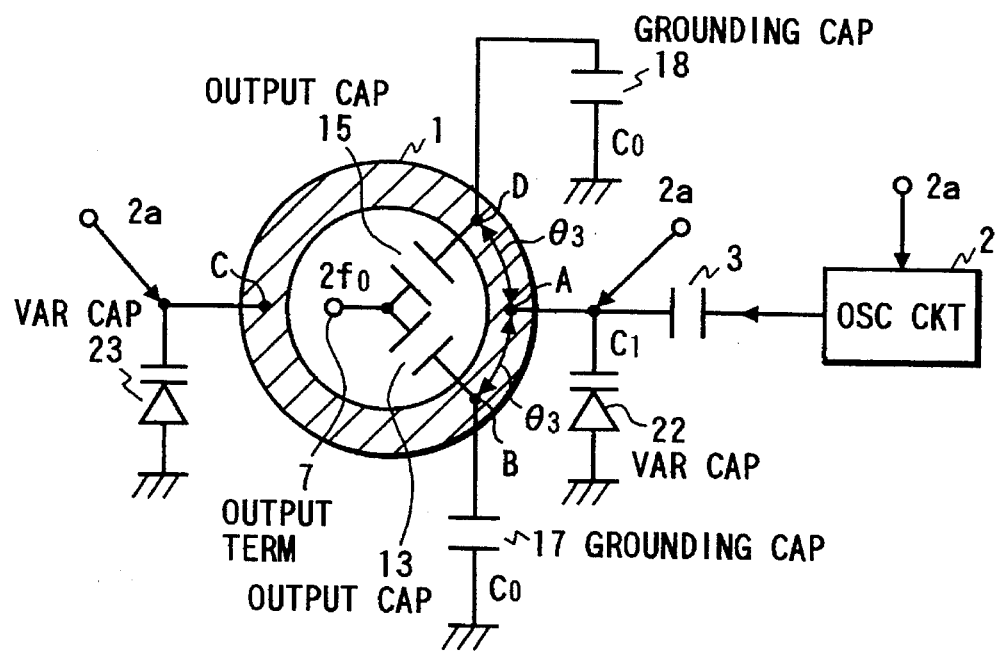

FIG. 7B is a schematic drawing of an oscillator of a second example of the sixth embodiment of this invention. The basic structure of the second example of the sixth embodiment is similar to the second example of the fifth embodiment shown in FIG. 6B and the difference is in that variable capacitances 22 and 23 having the same voltage-capacitance characteristic are used as the grounding capacitors coupling between the coupling point A and the ground and between the point C and the ground to provide a voltage control structure.

Operations of the oscillator of the first and second examples of the sixth embodiment will be described.

If the variable capacitances are not connected asymmetrically (without balance) to the two points A and C providing maximum voltages with respect to the fundamental frequency f0 and when the oscillation frequency is varied with a frequency control voltage inputted through a control input 2a, the points providing zero voltage with respect to the fundamental frequency on the ring resonator 1 move with the variation of the control voltage. Contrary, if the variable capacitances are connected symmetrically (balance) to the two points A and C providing the maximum voltages with respect to the fundamental frequency f0, the points on the ring resonator providing the zero voltage with respect to the fundamental frequency f0 always stay at the points B and D that is, they do not move with the variation of the oscillation frequency with a variation of the control voltage. Other operations are the same as the fifth embodiment.

As mentioned, according to tills embodiment, a small-size high frequency band voltage controlled oscillator having the same characteristic as the oscillators of the first to fifth embodiments can be provided even if the voltage controlling of the oscillation frequency is effected by that the variable capacitor 21 is connected between the coupling point A and the point C or by that the variable capacitors having the same voltage-capacitance characteristic is connected between the coupling point A and the ground and between the point C and the ground, and by that grounding capacitors having the same value are connected between point B and the ground and between D and the ground wherein the voltages at the points B and D are zero with respect to the fundamental frequency f0.

In this embodiment, the output capacitors 13 and 15 are used as the in-phase combining means. However, other in-phase combining circuits can be used for this embodiment. Further, the positions of the points B and D where the voltages are zero with respect to the fundamental frequency f0 and maximum with respect to the secondary harmonic frequency can be controlled by adding the grounding capacitor to the point C. Particularly, if the capacitance value of the grounding capacitor is equivalent to the capacitance value of the oscillation portion 2 viewed from the coupling point A, these two points B and D are at middle points of points A and C on the ring resonator 1.

EMBODIMENT 7

Hereinbelow a seventh embodiment of this invention will be described with reference to drawings.

Figure 8:
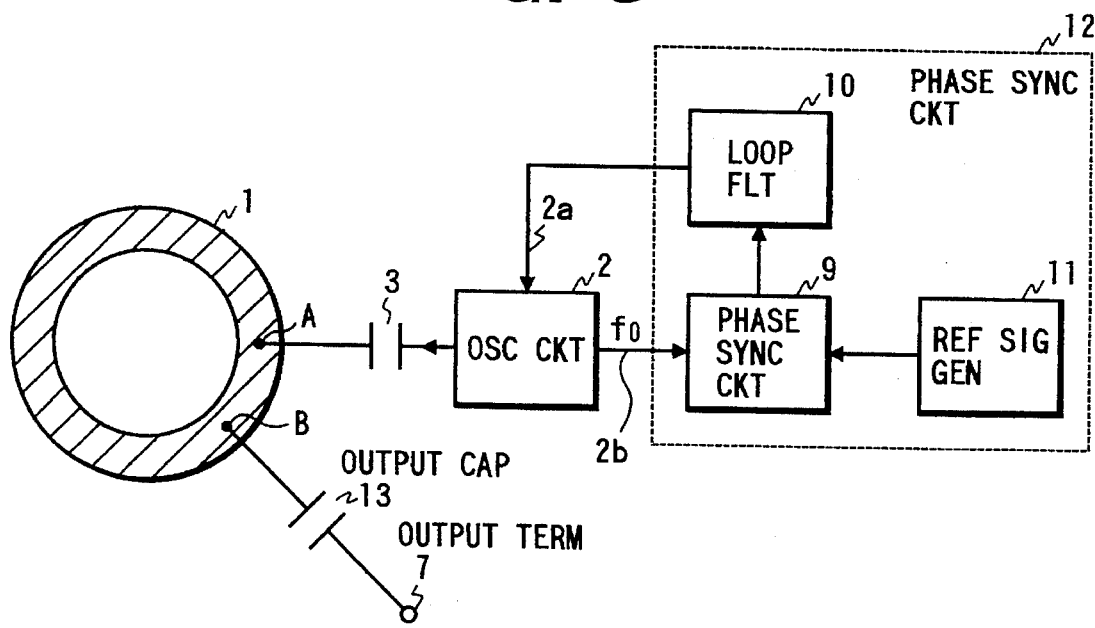
FIG. 8 is a schematic drawing of a frequency synthesizer of a seventh embodiment.

FIG. 8 is a schematic drawing of a frequency synthesizer of the seventh embodiment of this invention. The frequency synthesizer of the seventh embodiment comprises a phase synchronizing circuit 12 for receiving an oscillation output having the fundamental frequency f0 and generating a frequency control signal with reference to a reference signal, the oscillation circuit 2 for generating the oscillation output having the fundamental frequency f0, and the ring resonator 1, coupled with the oscillation circuit 2 at the coupling point A, for outputting a secondary harmonic component (2f0) as a resonant signal, at the point B which apart from the coupling point A by a line length less than a quarter of the line length of the ring resonator 1.

An operation of the frequency synthesizer of the seventh embodiment will be described.

At first, the oscillation circuit 2 oscillates at a frequency determined by the electrical length of the ring resonator 1 and the circuit constant of the oscillation portion 2. The phase synchronizing circuit 12 receives the fundamental frequency f0 from the oscillation circuit 2 and generates the frequency control signal with reference to the reference signal from the reference signal generator 11. The loop filter circuit 10 removes a high frequency component from the frequency control signal. The oscillation circuit 2 oscillates in accordance with the frequency control signal and thus, oscillates in phase with the reference signal. The oscillation circuit 2 supplies The fundamental frequency component to the coupling point A of the ring resonator 1 through the coupling capacitor 8. The ring resonator 1 resonates in response to the fundamental component and generates and outputs the secondary harmonic frequency component (2f0) at the point B which is outputted by the output terminal 7 through the output capacitor 18. That is, the point A on the ring resonator 1 shows a maximum voltage with respect to the fundamental frequency f0 and the point B shows a zero voltage with respect to the fundamental frequency f0 and a maximum voltage with respect to the secondary harmonic frequency 2f0. Therefore, the output is obtained from the point B through the output capacitor 13, so that the secondary harmonic frequency component can be obtained with the fundamental component suppressed. In other words, even order harmonic components are obtained and the fundamental component and odd order harmonic components are suppressed. As mentioned, in the frequency synthesizer, the synchronized frequency signal is produced at a low frequency band, on the other hand, the output synchronized frequency signal from the output terminal is obtained at the higher frequency band, so that a low power consumption of the high frequency band frequency synthesizer can be realized.

As mentioned above, according to this embodiment, a superior high frequency band frequency synthesizer having a small circuit scale and a small power consumption can be provided because the frequency-up converter is unnecessary by forming the phase synchronizing circuit through the fundamental component outputted by the oscillator and obtaining the secondary harmonic component from the ring resonator side as shown in FIG. 8.

In this embodiment, the oscillator including the oscillation circuit 2, the resonator 1, and the output terminal obtaining the secondary harmonic frequency component from the point B is the same as the first embodiment. However, the oscillators of the second to sixth embodiments can be used for the frequency synthesizer also in place of the oscillator shown in FIG. 1.

EMBODIMENT 8

Hereinbelow an eighth embodiment of this invention will be described with reference to drawings.

Figure 9:
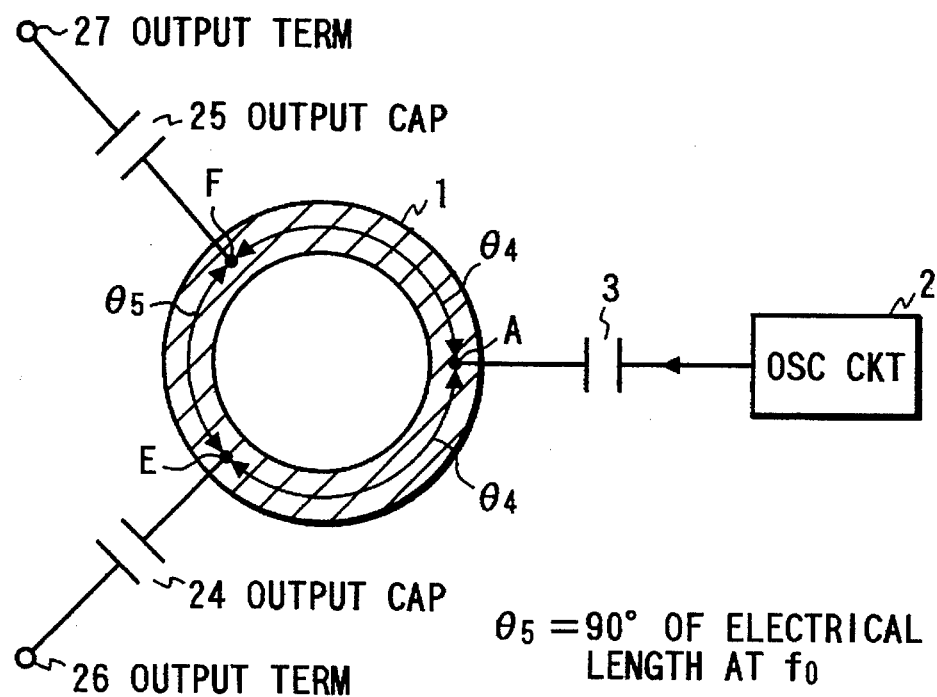
FIG. 9 is a schematic drawing of an oscillator of an eighth embodiment.

FIG. 9 is a schematic drawing of an oscillator of the eighth embodiment of this invention.

In FIG. 9, the basic structure of the eighth embodiment is similar to the first embodiment and the difference between the eighth embodiment and the first embodiment is in that instead of the output terminal 7, output terminals 26 and 27 are provided. The output terminals 26 and 27 are coupled to points E and F on the ring resonator 1 through output capacitances 24 and 25. The points E and F have the same line length from the coupling point A and are apart from each other by electrical length 90° at the fundamental frequency f0.

An operation of the oscillator of the eighth embodiment will be described.

Figure 10:
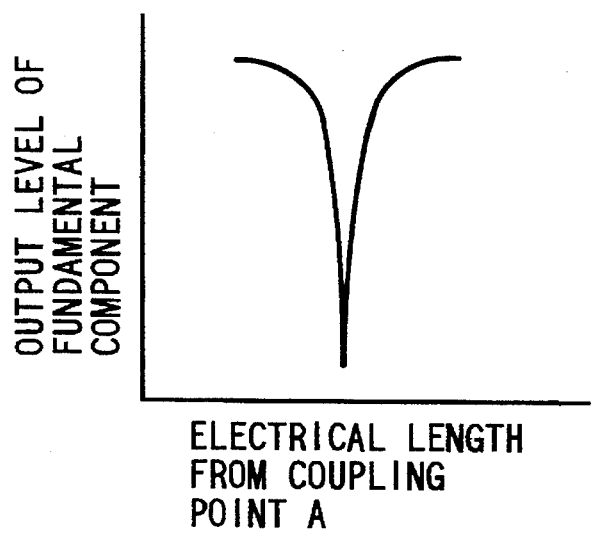
FIG. 10 is a graphic diagram of an eighth embodiment showing an output level change with respect to an electrical length from a coupling point.

At first, the oscillation circuit oscillates at the frequency f0 determined by the electrical length of the ring resonator 1 and the circuit constant of the oscillation circuit 2. FIG. 10 is a graphic diagram of the eighth embodiment showing an output level change with respect to an electrical length from the coupling point A. In FIG. 10, an output level at a position on the ring resonator 1 varies with the electrical length from the coupling point A. There is a point where an output level of the fundamental frequency is substantially zero voltage. However, any other points apart from this point provides the fundamental harmonic component with some output levels. In this case, points E and F are apart from the coupling point A by the same line length, so that outputs having the same level can be obtained at the output terminals 26 and 27. Further, because the points E and F have a phase difference of 90° at the oscillation frequency (fundamental frequency) f0, points E and F output the fundamental components having the phase difference of 90°, that is, they act as isolation ports and thus, do not affect each other.

As mentioned according to this embodiment, as shown in FIG. 9, a superior high frequency band oscillator having a distribution function with a simple circuit structure can be provided by obtaining the oscillator outputs from the two points E and F on the ring resonator 1 apart from the coupling point A by the same line length with the electrical length difference of 90° at the oscillation frequency.

EMBODIMENT 9

Hereinbelow a ninth embodiment of this invention will be described with reference to drawings.

Figure 11A:
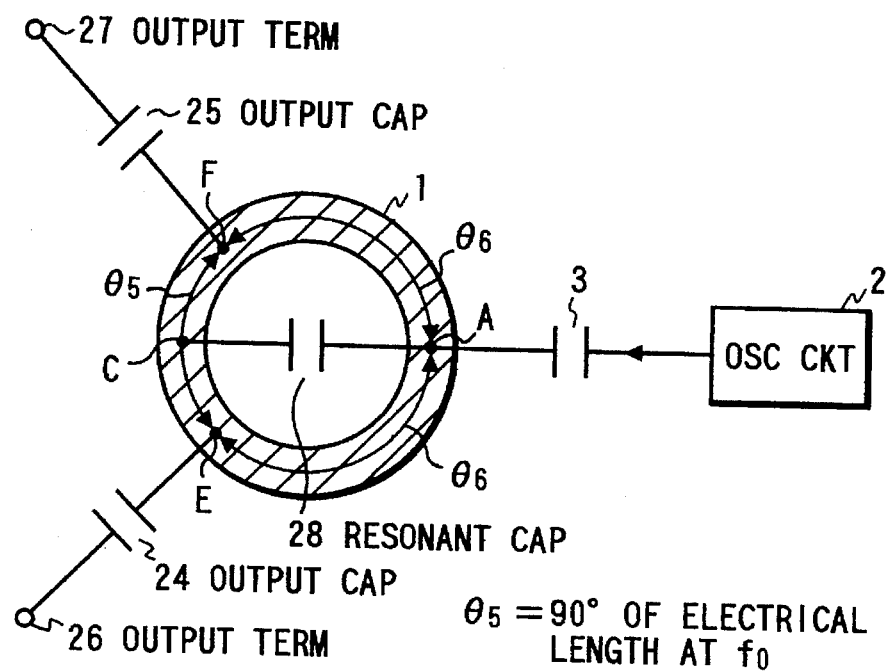
FIGS. 11A and FIG. 11B are schematic drawings of oscillators of first and second examples of a ninth embodiment.
Figure 11B:
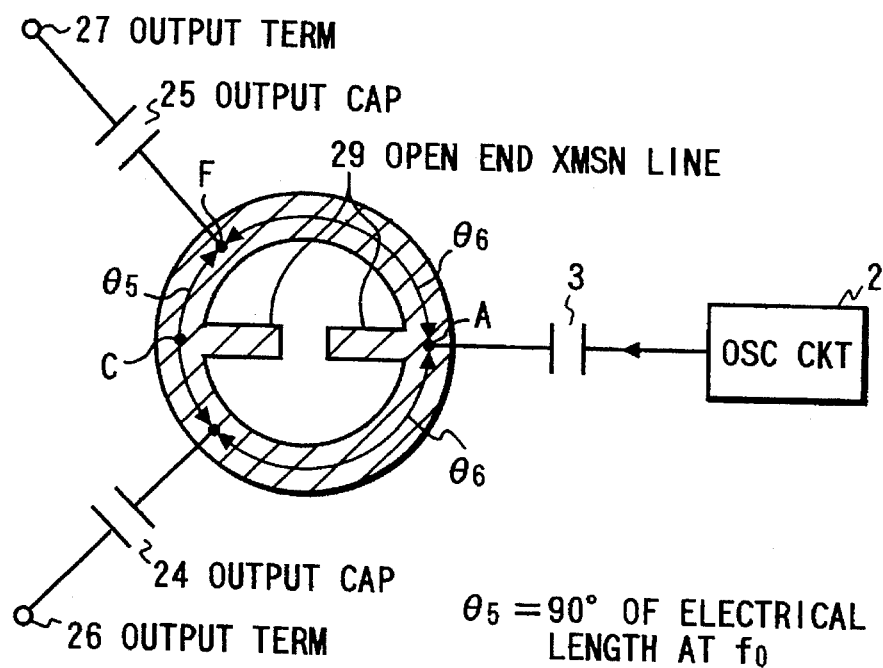

FIGS. 11A and 11B are schematic drawings of oscillators of first and second examples of the ninth embodiment of this invention respectively. In FIG. 11A, the difference between the first example of the ninth embodiment and eighth embodiment is in that a resonant capacitor 28 is further provided between two points, namely, the coupling point A and the point C apart from the coupling point A by a half of the line length of the ring resonator 1. In FIG. 11B, the difference between the second example of the ninth embodiment and eighth embodiment is in that open end transmission lines 29 are provided to the coupling point A and the point C which is apart from the coupling point A by the half of the line length of the ring resonator 1.

Operations of the oscillators of the ninth embodiment will be described.

The basic operations are the same as the eighth embodiment. The difference is in that the line length of the ring resonator 1 can be shortened by providing the resonant capacitor 28 in the first example of the ninth embodiment and the line length of the ring resonator 1 can be shortened by providing the open end transmission lines 29 in the second example of the ninth embodiment.

As mentioned above, according to this embodiment, the ring resonator 1 can be miniaturized by connecting the resonant capacitance 28 or the open end transmission lines 29 as shown in FIGS. 11A and 11B, so that a superior small high frequency oscillator having the distribution function with a simple structure can be realized.

Moreover, in FIG. 11B, both open end transmission lines 29 are connected to the two points, namely, the coupling point A and the point which is apart from the coupling point A by a half of the line length of the ring resonator. However, it is also possible that an open end transmission line is connected to only either of the two points.

EMBODIMENT 10

Hereinbelow a tenth embodiment of this invention will be described with reference to drawings.

Figure 12:
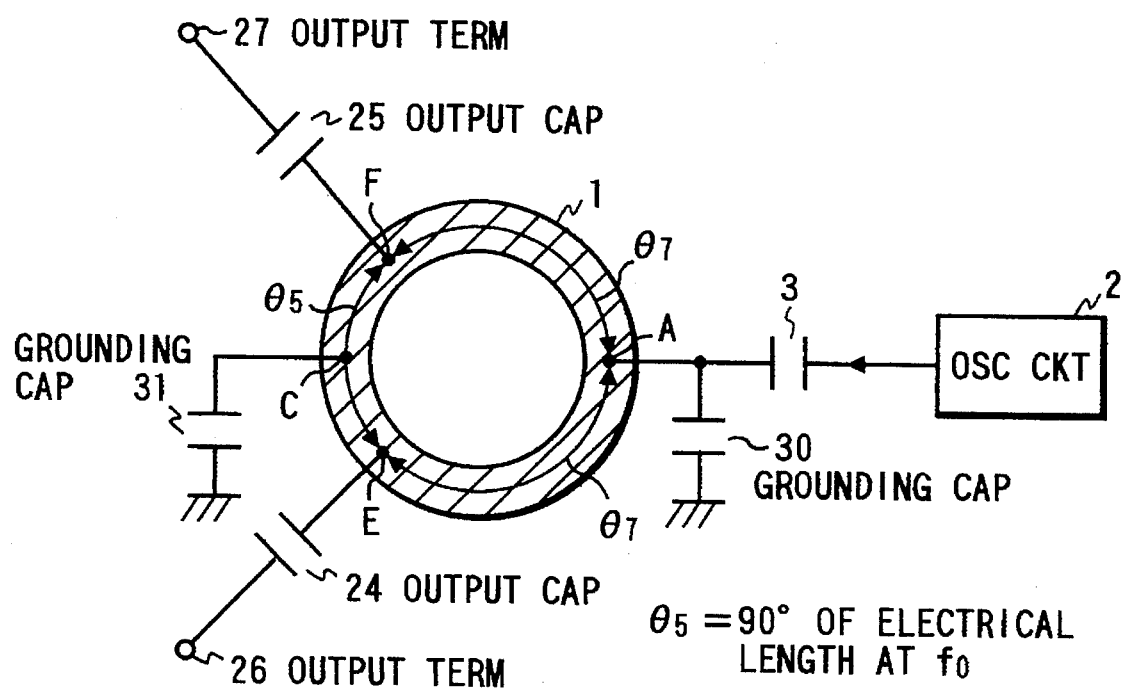
FIG. 12 is a schematic drawing of an oscillator of a tenth embodiment.

FIG. 12 is a schematic drawing of an oscillator of the tenth embodiment of this invention. In FIG. 12, the difference between the tenth embodiment and the eighth embodiment is in that grounding capacitors 30 and 31 having the same capacitance value are connected to the coupling point A and the point C apart from the coupling point A by the half of the line length of the ring resonator 1.

An operation of the oscillator of this embodiment will be described.

The basic operation is the same as the eighth embodiment. The difference is in that the line length of the ring resonator 1 can be shortened by providing the grounding capacitors 30 and 31.

As mentioned above, according to this embodiment, the ring resonator 1 can be miniaturized by connecting the grounding capacitances 30 and 31 as shown in FIG. 12, so that a superior small high frequency oscillator having the distribution function with a simple structure can be realized.

Moreover, the embodiments in this specification show the ring resonator 1 as the resonator. However, there is no limitation in the shape of the resonator to the ring shape and it can be realised with any shape throughout the specification.

As mentioned above, according to this invention there is provided an oscillator comprising an oscillation portion, having a ring resonator and a negative resistance active circuit coupled to the ring oscillator through a coupling capacitance wherein an output is obtained from a point on the ring resonator where a voltage is zero with respect to the oscillation frequency. Therefore, it is possible to obtain the secondary harmonic component with the fundamental component suppressed, so that a superior high frequency band oscillator having a simple structure and a small power consumption current can be realized.

EMBODIMENT 11

Hereinbelow will be described an eleventh embodiment of this invention with reference to drawings.

Figure 13:
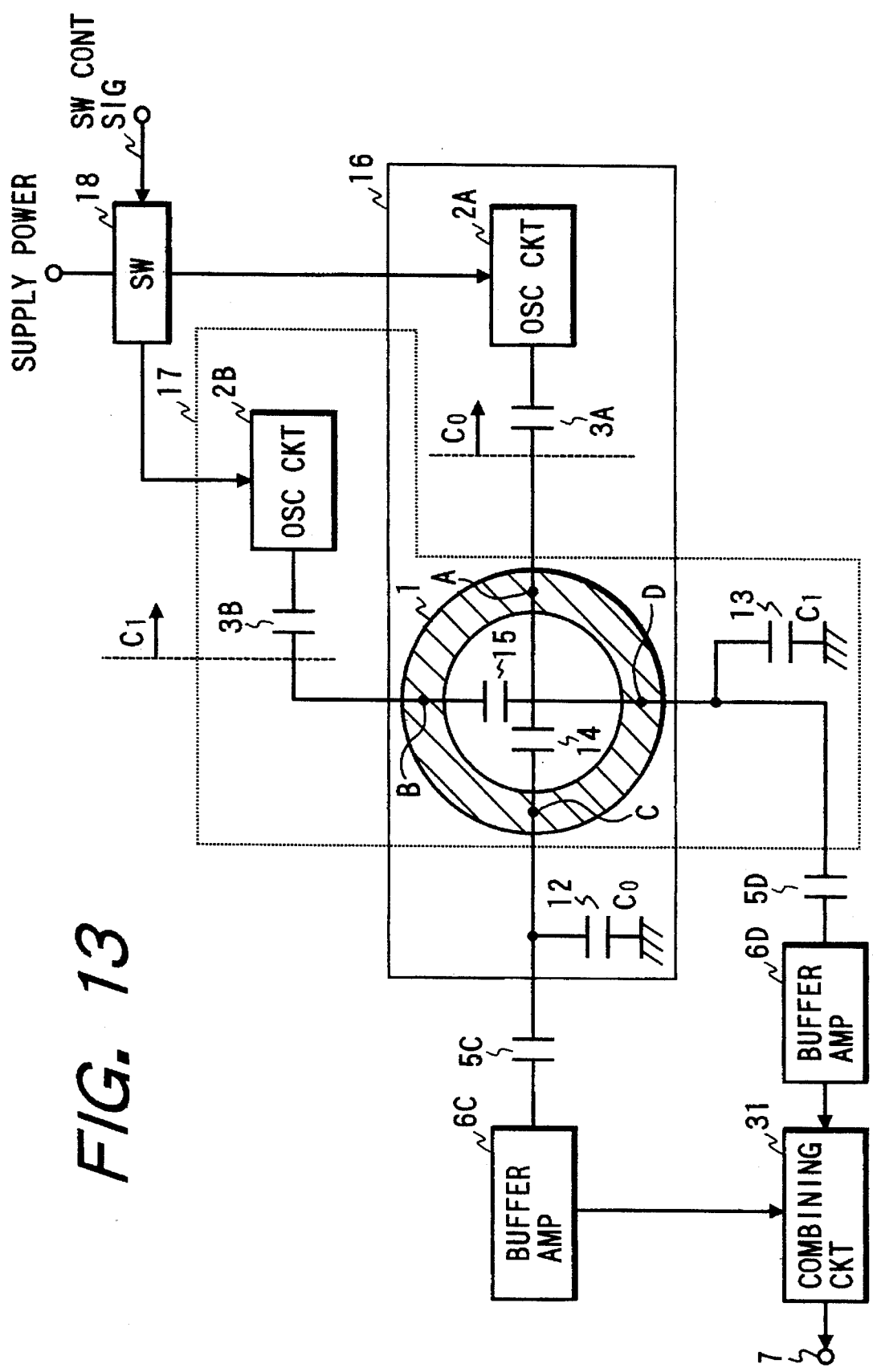
FIG. 13 is a schematic drawing of an oscillator of an eleventh embodiment.

FIG. 13 is a schematic drawing of an oscillator of the eleventh embodiment of this invention.

In FIG. 13, the oscillator of the eleventh embodiment comprises a first oscillation portion 16 having a ring resonator 1 having points A to D equidistantly dividing the ring resonator 1 and a first oscillation circuit 2A coupled to the point A, a second oscillation portion 17, having the resonator 1 and a second oscillation circuit 2B coupled to the point B, a switch 18 for supplying a supply power to either of the first or second oscillation circuit 2A or 2B in accordance with a switch control signal, and buffer amplifiers 6C and 6D for amplifying oscillation outputs from points C and D wherein the points C and D are the opposite sides of the ring resonator 1 from the points A and B respectively.

The switch 18 supplies the supply power to either of the oscillation circuits 2A or 2B in accordance with the switch control signal. The first oscillation circuit 2A is coupled to the point A on the ring resonator 1 through a capacitor 3A. The second oscillation circuit 2B is coupled to the point B on the ring resonator 1 through a capacitor 3B. A grounding capacitor 12, having a capacitance equivalent a capacitance of the oscillation circuit 2A viewed from the point A, couples the point C to the ground wherein the point C is apart from the point A by a half of the line length of the ring resonator 1. A grounding capacitor 13, having a capacitance equivalent a capacitance of the oscillation circuit 2B viewed from the point B, couples the point D to the ground wherein the point D is apart from the point B by a half of the line length of the ring resonator 1. A resonant capacitor 14 is connected between the points A and C and a resonant capacitor 15 is connected between the points B and D. The buffer amplifier 6C is coupled to the point C through a capacitor 5C and the buffer amplifier 6D is coupled to the point D through a capacitor 5D. A combining circuit 31 combines the outputs of the buffer amplifiers 6C and 6D.

An operation of the oscillator of the eleventh embodiment will be described.

At first, when the oscillation circuit 16 is supplied with the supply power by the switch 18, the oscillator 16 oscillates at a frequency f1 determined by an electrical length of the ring resonator 1, a circuit constant of the oscillation circuit 2A, a capacitance of the grounding capacitor 12, and a capacitance of the resonant capacitor 14 wherein the point A shows a maximum voltage with respect to the fundamental frequency f1 and a sinusoidal voltage distribution along the line of the ring resonator 1 with respect to the fundamental frequency f1. The points B and D apart from the point A by a quarter of the line length of the ring resonator 1 show minimum voltages with respect the fundamental component of the oscillation frequency f1, that is, they act as isolation ports and the point C apart by a half of the line length from the point A shows a maximum voltage with respect the fundamental component of the oscillation frequency. Similarly, the oscillator 17 oscillates at an oscillation frequency f2 determined by the electrical length of the ring resonator 1, a circuit constant of the oscillation portion 2B, a capacitance of the grounding capacitor 13, and a capacitance of the resonant capacitor 15 wherein the point B shows a maximum voltage with respect to the fundamental component of the oscillation frequency f2 and a sinusoidal voltage distribution along the line of the ring resonator 1, the points A and C apart from the point B by a quarter of the line length of the ring resonator 1 show minimum voltages with respect to the oscillation frequency, that is, they act as isolation ports, and the point D apart by a half of the line length from the point B shows a maximum voltage. This structure provides two independent oscillation portions 16 and 17 which do not affect each other using one resonator 1 and provides stable oscillation outputs at the output terminal 7 derived from the points C and D through the capacitors 5C and 5D, the buffer amplifiers 6C and 6D, and the combining circuit 31.

It is generally known that in the voltage controlled oscillator, if a frequency sensitivity to a control voltage is made high, a noise characteristic deteriorates. Contrary, dividing a necessary oscillation frequency band into high and low bands and assigning the oscillation portions 16 and 17 to these bands, namely, the assigning of low and high bands can make the frequency sensitivity of each oscillator small, so that the noise characteristic of the oscillator can be improved.

Moreover, in the time-division two way communication system generally used for the digital mobile unit communication system, transmitting and receiving are effected using the radio wave frequencies having the same frequency at the antenna terminal. Therefore, a local oscillator should have a band broader than the radio wave frequency. In that case, the oscillator can be made to have a low noise due to the effect mentioned above, that is, by assigning the oscillation portions 16 and 17 to transmission frequency band and the receiving frequency band.

Moreover, because either of oscillation portions operates at an instance by switching of supplying of the supply power between the oscillation portions 16 and 17 by the switch circuit 18, so that the consumed current does not increase.

As mentioned, according to this embodiment, the oscillation circuit 2A is connected to the point A through the coupling capacitor 3A, the oscillation circuit 2B is connected to the point B through the coupling capacitor 3B, the grounding capacitor 12 having the capacitance equivalent to that of the oscillation circuit 2A viewed from the point A is connected to the point C, and the grounding capacitor 13 having the capacitance equivalent to that of the oscillation circuit 2B viewed from the point B is connected to the point D wherein respective points equidistantly divide the line length of the ring resonator into four. Therefore, two independent high frequency band oscillation portions 16 and 17 which do not affect each other can be provided with one resonator 1 and the miniaturization of the resonator 1 can be provided by adding resonant capacitors 14 and 15 between the points A and C and between B and D.

Moreover, the noise characteristic can be improved by making the frequency sensitivity required for one oscillator small, so that a small and low noise high frequency band oscillator can be provided.

Further, in the structure shown in FIG. 13, both the resonant capacitors 14 and 15 are added between the points A and C and between points B and D. However, it is possible that only one of the resonant capacitor is added.

EMBODIMENT 12

Hereinbelow a twelfth embodiment will be described with reference to drawings.

Figure 14:
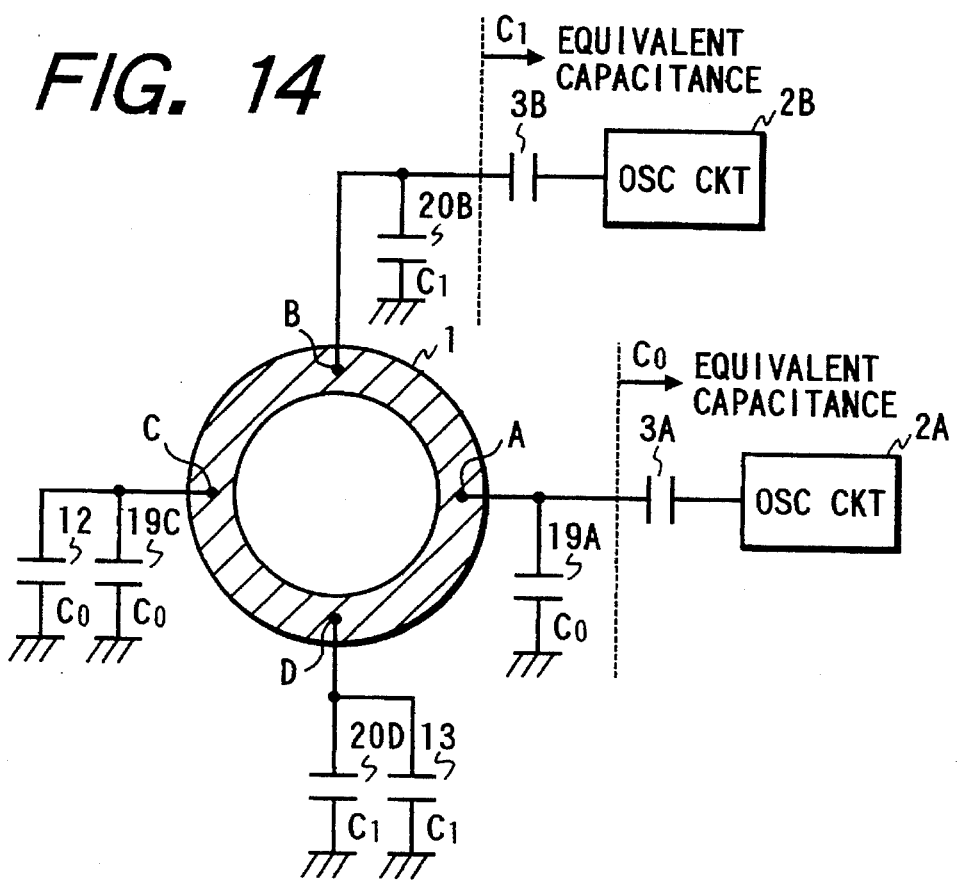
FIG. 14 is a schematic drawing showing a main portion of an oscillator of a twelfth embodiment.

FIG. 14 is a schematic drawing showing a main portion of an oscillator of the twelfth embodiment. In FIG. 14, the difference between the twelfth embodiment and the eleventh embodiment is in that grounding capacitors 19A and 19C having the same capacitance couple the points A and C to the ground and grounding capacitors 20B and 20D having the same capacitance couple the points B and D to the ground respectively. Other structure is similar to the eleventh embodiment. That is, the output capacitors 5C and 5D, the buffer amplifier 6C and 6D, the combining circuit 31, the output terminal 7, and switch circuit 18 are actually provided but are omitted to avoid the complication in the drawing.

An operation of the oscillator of the twelfth embodiment will be described.

The basic operation is the same as that of the eleventh embodiment and the difference is in that the oscillation portion 16 oscillates at the frequency f1 determined by the electrical length of the ring resonator 1, the circuit constant of the oscillation circuit 2A, and grounding capacitors 12, 19A, and 19C and the oscillation portion 17 oscillates at the frequency f2 determined by the electrical length of the ring resonator 1, the circuit constant of the oscillation circuit 2B, and grounding capacitors 13, 20B, and 20D.

Figure 15:
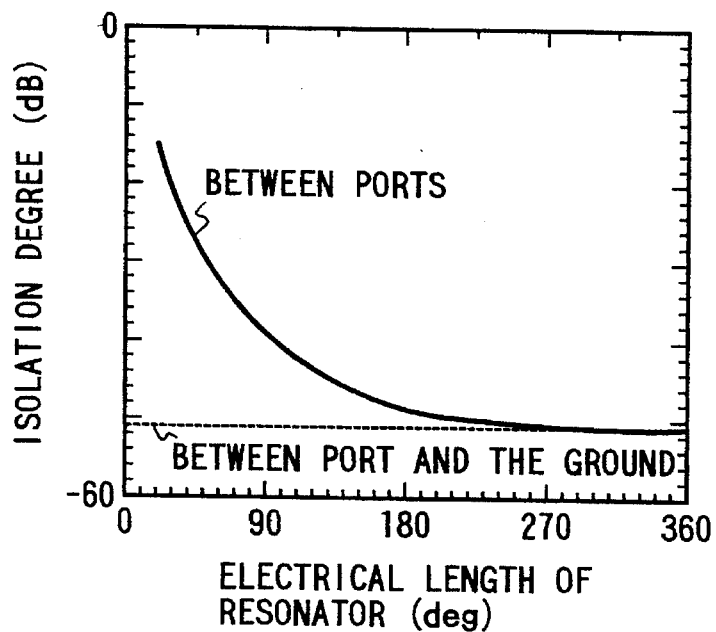
FIG. 15 shows isolation characteristics of eleventh and twelfth embodiments.

FIG. 15 shows a isolation characteristic between isolation ports and a isolation characteristic between a port and the ground of the eleventh embodiment with respect to a degree of shortening the resonator length. In the eleventh embodiment, if the length of the resonator is shortened to two thirds thereof, there is a little decrease in the isolation degree. However, the isolation degree begins to decrease if the length of the resonator is shortened more. Contrary, the oscillator of the twelfth embodiment maintains a good characteristic of isolation degree between the isolation ports irrespective of the degree of shortening the resonator length as shown.

As mentioned above, according to this invention, as shown in FIG. 14, the oscillation circuit 2A is connected to the point A through the coupling capacitor 3A, the oscillation circuit 2B is connected to the point B through the coupling capacitor 3B, the grounding capacitor 12 equivalent to the capacitance of the oscillation portion 2A viewed from the point A is connected to the point C, and the grounding capacitor 13 equivalent to the capacitance of the oscillation portion 2B viewed from the point B is connected to the point D wherein respective points equidistantly divide the line length of the ring resonator into four. Therefore, two independent high frequency band oscillators which do not affect each other can be provided with one common resonator 1 and the miniaturization of the resonator can be provided in a larger degree by adding grounding capacitors 19A, 19C, 20B and 20D.

In the structure shown in FIG. 14, all points A to D are connected to the grounding capacitors. However, it is also possible that either of a pair of points A and C or a pair of points B and D is provided with grounding capacitors. Moreover, the structure has the grounding capacitors connected to the point C or D in parallel. However, it is also possible that these capacitors are combined into single capacitors respectively.

EMBODIMENT 13

Hereinbelow a thirteenth embodiment will be described with reference to drawings.

Figure 16:
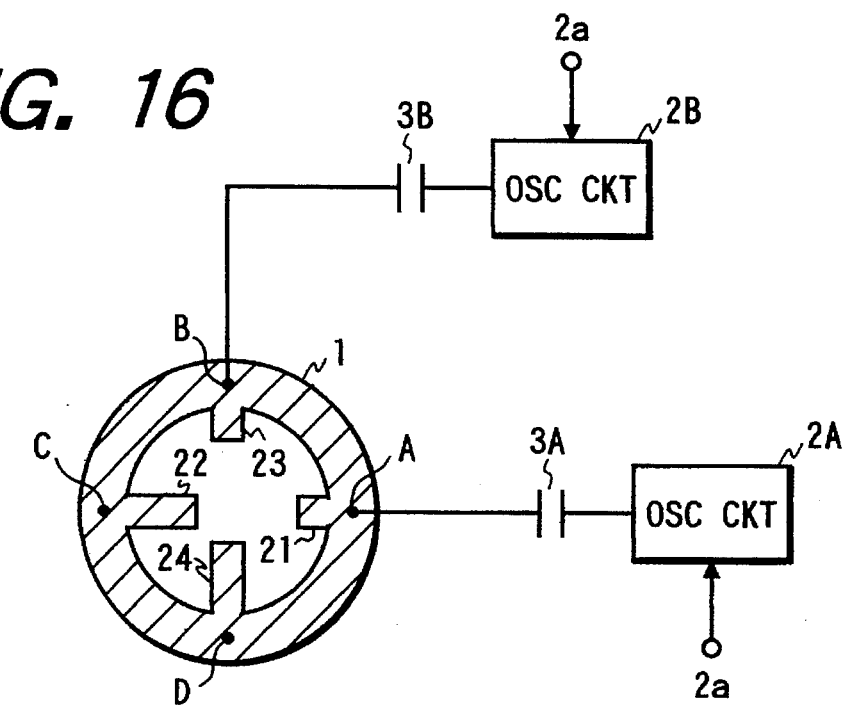
FIG. 16 is a schematic drawing showing a main portion of an oscillator of a thirteenth embodiment.

FIG. 16 is a schematic drawing showing a main portion of an oscillator of the thirteenth embodiment. In FIG. 16, the difference between thirteenth embodiment and the twelfth embodiment is in that grounding capacitors 19A, 19C, 20B and 20D are replaced by open-end transmission lines 21 to 24 and other structure similar to eleventh embodiment. That is, the output capacitors 5C and 5D, the buffer amplifiers 6C and 6D, the combining circuit 31, the output terminal 7, the grounding capacitors 12 and 13, and switch circuit 18 are omitted in FIG. 16.

An operation of the oscillator having the structure mentioned above will be described.

The basic operation is the same as that of the twelfth embodiment and the difference is in that the oscillation portion 16 oscillates at the frequency f1 determined by the electrical length of the ring resonator 1, the circuit constant of the oscillation circuit 2A, and electrical lengths of the open-end transmission lines 21 and 22 and grounding capacitors 12 and the oscillation portion 17 oscillates at the frequency f2 determined by the electrical length of the ring resonator 1, the circuit constant of the oscillation circuit 2B, and electrical lengths of the open-end transmission lines 23 and 24 and grounding capacitors 13. As similar to the twelfth embodiment, the electrical length of the ring resonator 1 can be shortened. Further, due to the distributed constant capacitances, it is possible that the resonator is made flat.

As mentioned above, according to this embodiment, as shown in FIG. 16, the oscillation circuit 2A is connected to the point A through the coupling capacitor 3A, the oscillation circuit 2B is connected to the point B through the coupling capacitor 3B, and the open-end transmission lines are added to points A to D, wherein respective points equidistantly divides the line length of the ring resonator into four. Therefore, the miniaturization of the resonator can be provided. Moreover, the noise characteristic can be improved by making the frequency sensitivity necessary for one oscillator small. Therefore, a small size and low noise high frequency band oscillator can be realized.

Moreover, in the structure shown in FIG. 16, all lump constant capacitances are replaced by the open-end transmission lines. However, it is also possible that a portion of them are replaced.

EMBODIMENT 14

Hereinbelow a fourteenth embodiment will be described with reference to drawings.

Figure 17:
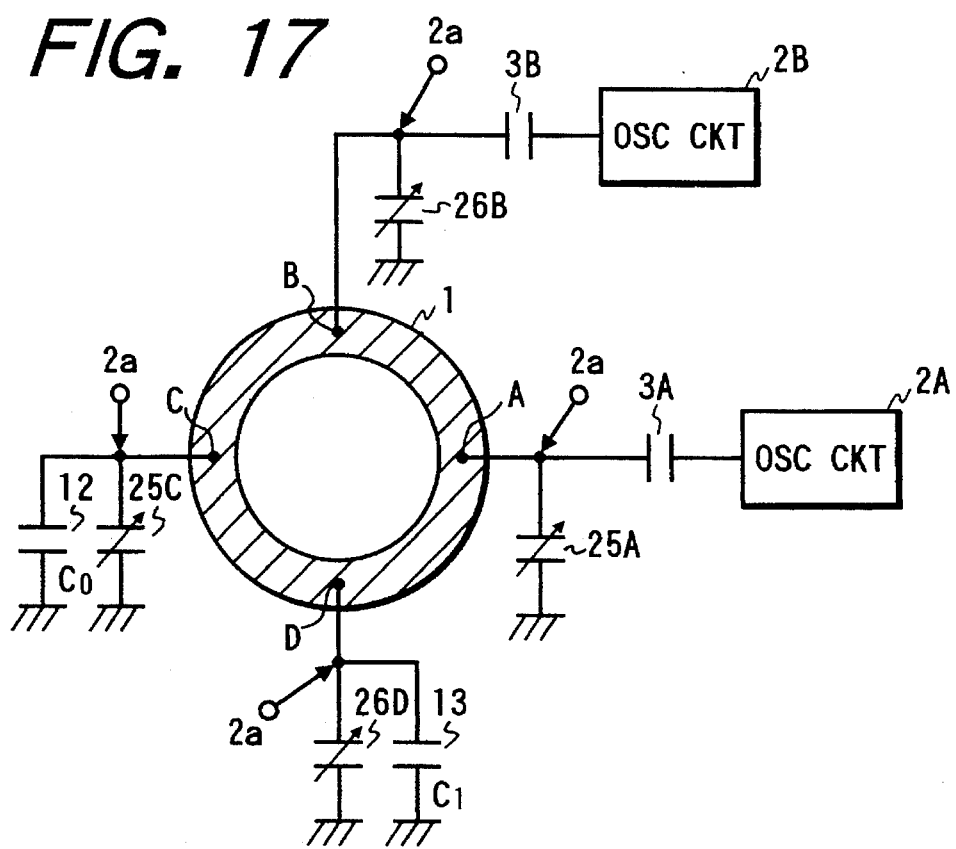
FIG. 17 is a schematic drawing showing a main portion of an oscillator of a fourteenth embodiment.

FIG. 17 is a schematic drawing showing a main portion of an oscillator of the fourteenth embodiment. In FIG. 17, the difference between the fourteenth embodiment and the twelfth embodiment is in that variable grounding capacitors 25A and 25C having the same characteristic are added to the points A and C on the ring resonator 1 and variable grounding capacitors 26B and 26D having the same characteristic are added to the points B and D for the voltage controlling. Other structures are similar to the eleventh embodiment. That is, the output capacitors 5C and 5D, the buffer amplifiers 6C and 6D, the combining circuit 31, the output terminal 7, and switch circuit 18 are omitted.

An operation of the oscillator of the fourteenth embodiment will be described.

In the oscillation portion 16, if capacitances of the variable capacitors added to the points A and C where the voltages are maximum with respect to the oscillation frequency are not equal to each other, with a variation of the oscillation frequency by the control voltage via the control input 2a the point on the ring resonator 1 showing the minimum voltage with respect to the oscillation frequency would moves along the resonator 1. Contrary, when the variable capacitors 25A and 25c which are equivalent to each other are added to the points A and C, the variation of the oscillation frequency does not move the points on the ring resonator 1 showing the minimum voltage with respect to the oscillation frequency.

Similarly, in the oscillation portion 17, when the variable capacitors 26B and 26D which are equivalent to each other are added to the points B and D showing the maximum voltage with respect to the oscillation frequency as shown in FIG. 17, the variation of the oscillation frequency by the control voltage via the control input 2a does not move the points on the ring resonator 1 showing the minimum voltage with respect to the oscillation frequency. Other operations are similar to the twelfth embodiment.

As mentioned above, according to this embodiment, as shown in FIG. 17, the oscillation circuit 2A is connected to the point A through the coupling capacitor 3A, the oscillation circuit 2B is connected to the point B through the coupling capacitor 3B, the grounding capacitor 12 having a capacitance equivalent to that of the oscillation circuit 2A viewed from the point A is connected to the point C, and the grounding capacitor 13 having a capacitance equivalent to that of the oscillation circuit 2B viewed from the point B is connected to the point D wherein respective points equidistantly divide, the line length of the ring resonator 1 into four, the variable capacitors 25A and 25C having the same voltage-capacitance characteristic are connected between point A and the ground and between the point C and the ground, and the variable capacitors 26B and 26D having the same voltage-capacitance characteristic are connected between point B and the ground and between the point D and the ground. Therefore, if the oscillation frequency is controlled by the voltage of the frequency control signal, a superior high frequency voltage controlled oscillator having a small size, a superior noise characteristic, and the characteristic equivalent to the oscillator described in the eleventh to thirteenth embodiments is provided.

EMBODIMENT 15

Hereinbelow a fifteenth embodiment will be described with reference to drawings.

Figure 18:
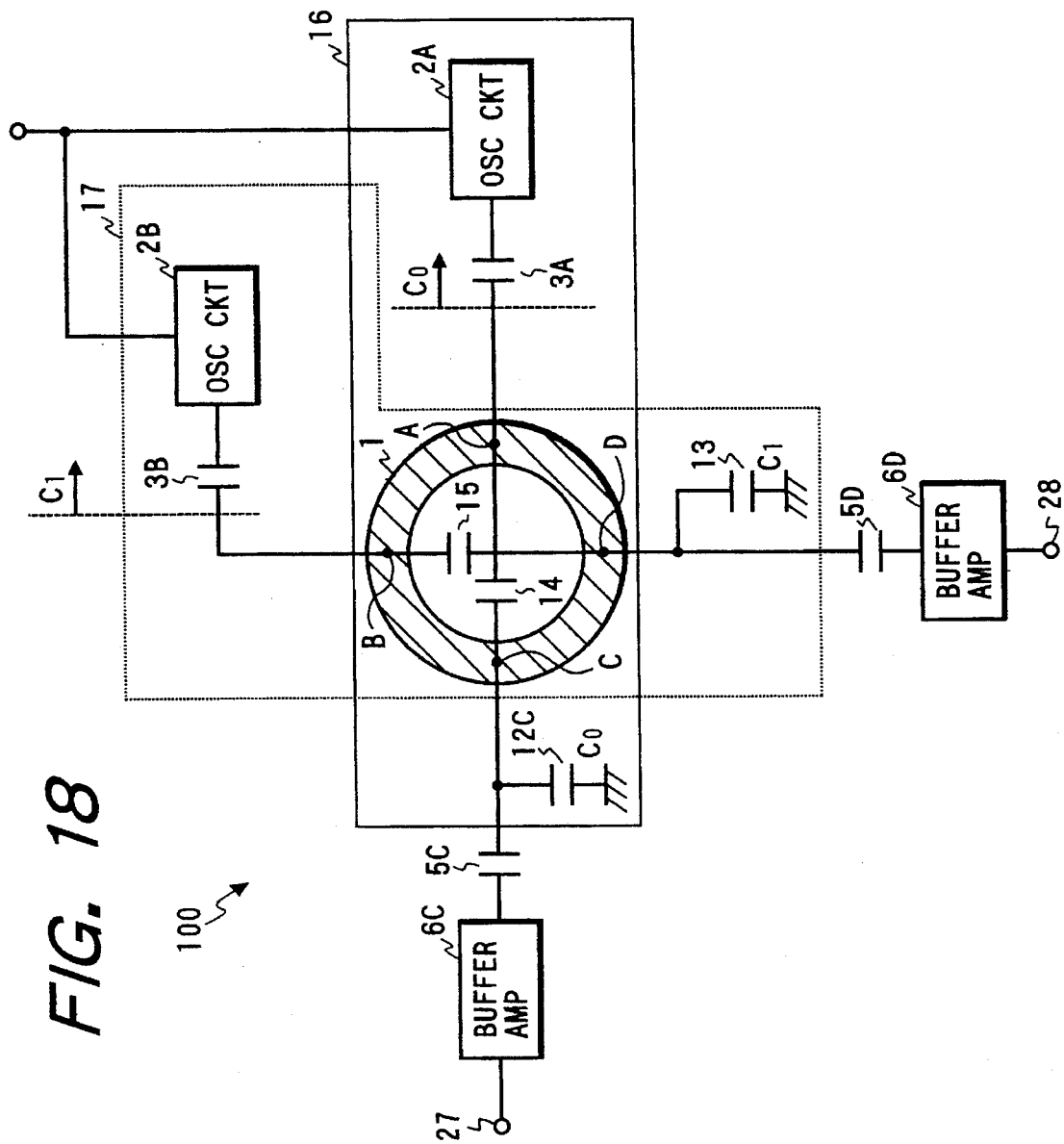
FIG. 18 is a schematic drawing showing a main portion of an oscillator of a fifteenth embodiment.

FIG. 18 is a schematic drawing of an oscillator of the fifteenth embodiment. In FIG. 18, the difference between fifteenth and eleventh embodiments is in that the oscillation portions 16 and 17 oscillate at the same time and outputs are obtained at separate output terminals 27 and 28 through output capacitors 5C and 5D and the buffer amplifiers 6C and 6D.

An operation of the oscillator of the fifteenth embodiment will be described.

The basic operation is similar to the eleventh embodiment. The oscillator 16 oscillating at the frequency f1 shows a maximum voltage at the point A and shows a sinusoidal voltage distribution along the line of the ring resonator 1 wherein the points B and D which are apart from the point A by a quarter of the line length of the ring resonator 1 show minimum voltage and the point C which is apart from the point A by a half of the line length of the ring resonator 1 shows a maximum voltage with respect to the oscillation frequency f1. On the other hand, the oscillation portion 17 oscillating at the frequency f2 shows a maximum voltage at the point B and shows a sinusoidal voltage distribution along the line of the ring resonator 1 wherein the points A and C which are apart from the point B by a quarter of the line length of the ring resonator 1 show minimum voltages and the point D apart from a half of the line length of the ring resonator 1 shows a maximum voltage with respect to the oscillation frequency f2.

If a relation that the isolation degree between points A and B is larger than the injection-locked gain is true between oscillation frequencies of two oscillation portions, both act as independent oscillators which do not affect each other though both oscillation portions 16 and 17 oscillate at the same time. Therefore, though both oscillators operate at the same time, the oscillation output of the oscillator 16 is provided at the output terminal 27 and the oscillation output of the oscillation portion 17 is attenuated by the amount corresponding to the isolation between the points B and C. Similarly, the oscillation output of the oscillation portion 17 is provided at the output terminal 28 and the oscillation output of the oscillation portion 16 is attenuated by the amount corresponding to the isolation between the points A and D.

Figure 22:
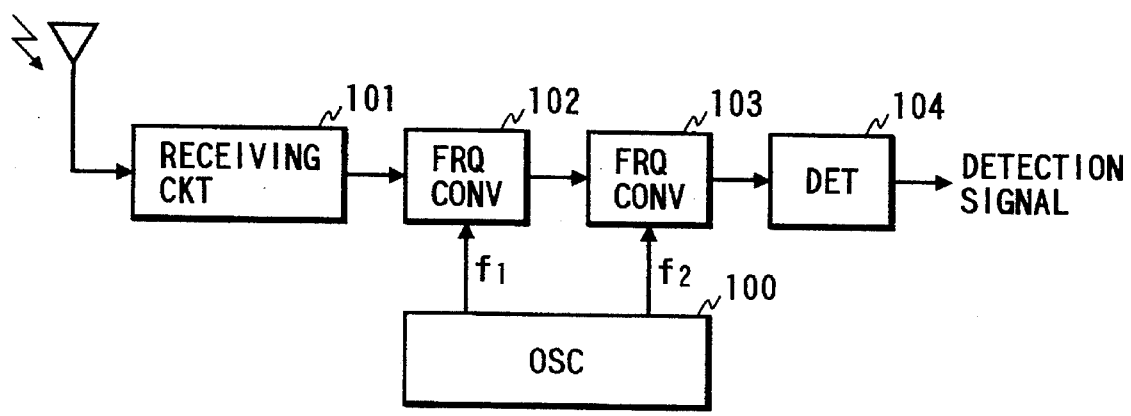
FIG. 22 is a block diagram of an example circuit using the oscillator of the fifteenth embodiment.

Generally, in the mobile unit communication, the method of receiving and decoding through twice frequency converting is frequently used. Therefore, since two local oscillator are necessary, if this circuit structure is applied to it, the whole structure of the local oscillator can be simplified. FIG. 22 is a block diagram of an example circuit using the oscillator of the fifteenth embodiment. In FIG. 22, a radio wave signal is received by a receiving circuit 101. A received radio signal is frequency converted by a first frequency converter 102 using the oscillation signal having the oscillation frequency f1. An output of the frequency converter 102 is frequency converted by a second frequency converter 103 using the oscillation signal having the oscillation frequency f2 again. Then, an output of the second frequency converter 103 is detected by a detector 104.

As mentioned above, according to this embodiment, as shown in FIG. 18, the oscillation circuit 2A is connected to the point A through the coupling capacitor 3A, the oscillation circuit 2B is connected to the point B through the coupling capacitor 3B, the grounding capacitor 12C equivalent to the capacitance of the oscillation circuit 2A viewed from the point A is connected to the point C, and the grounding capacitor 13 equivalent to the capacitance of the oscillation circuit 2B viewed from the point B is connected to the point D wherein respective points equidistantly divide the line length of the ring resonator into four and the oscillation frequencies of two oscillators are suitably set, so that two independent high frequency band oscillators which do not affect each other are provided with one common resonator 1 even if the two oscillators oscillate at the same time. Therefore, the circuit structure of the whole of the local oscillator can be simplified.

FIG. 18 shows the oscillation circuits 2A and 2B according to the structure of the eleventh embodiment. However, the oscillation circuits 2A and 2B of twelfth to fourteenth embodiments can be used for this embodiment.

EMBODIMENT 16

Hereinbelow a sixteenth embodiment of this invention will be described with reference to drawings.

Figure 19:
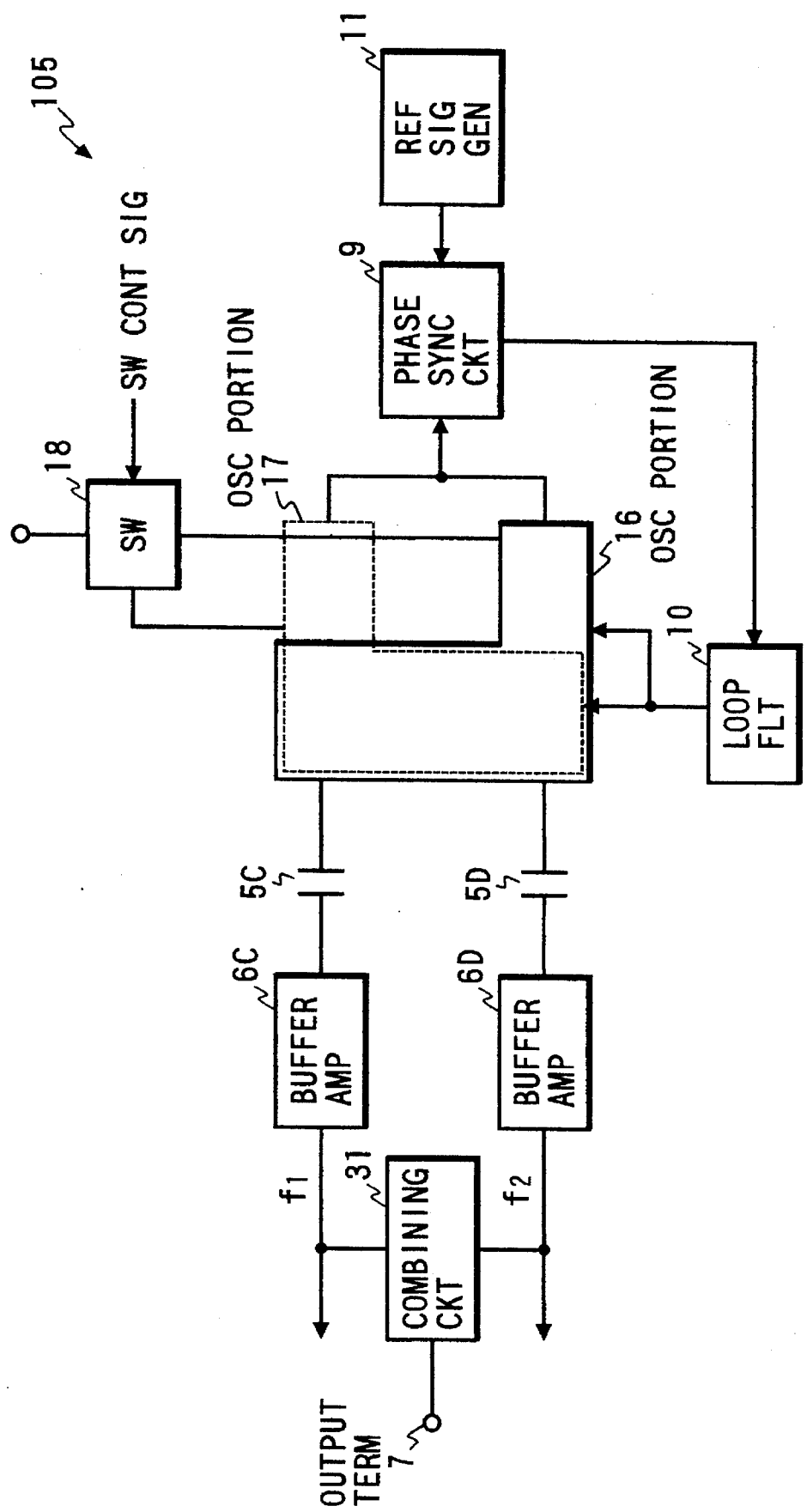
FIG. 19 is a schematic drawing of a frequency synthesizer of a sixteenth embodiment.
Figure 20:
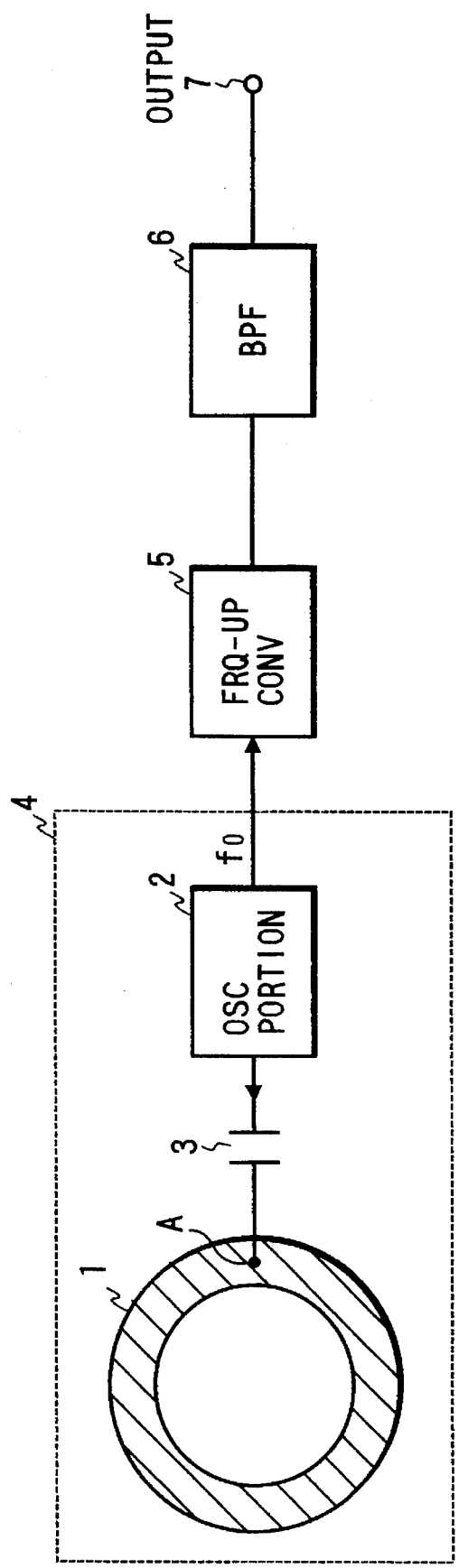
FIG. 20 is a block diagram of a prior art high frequency band oscillator.
Figure 21:
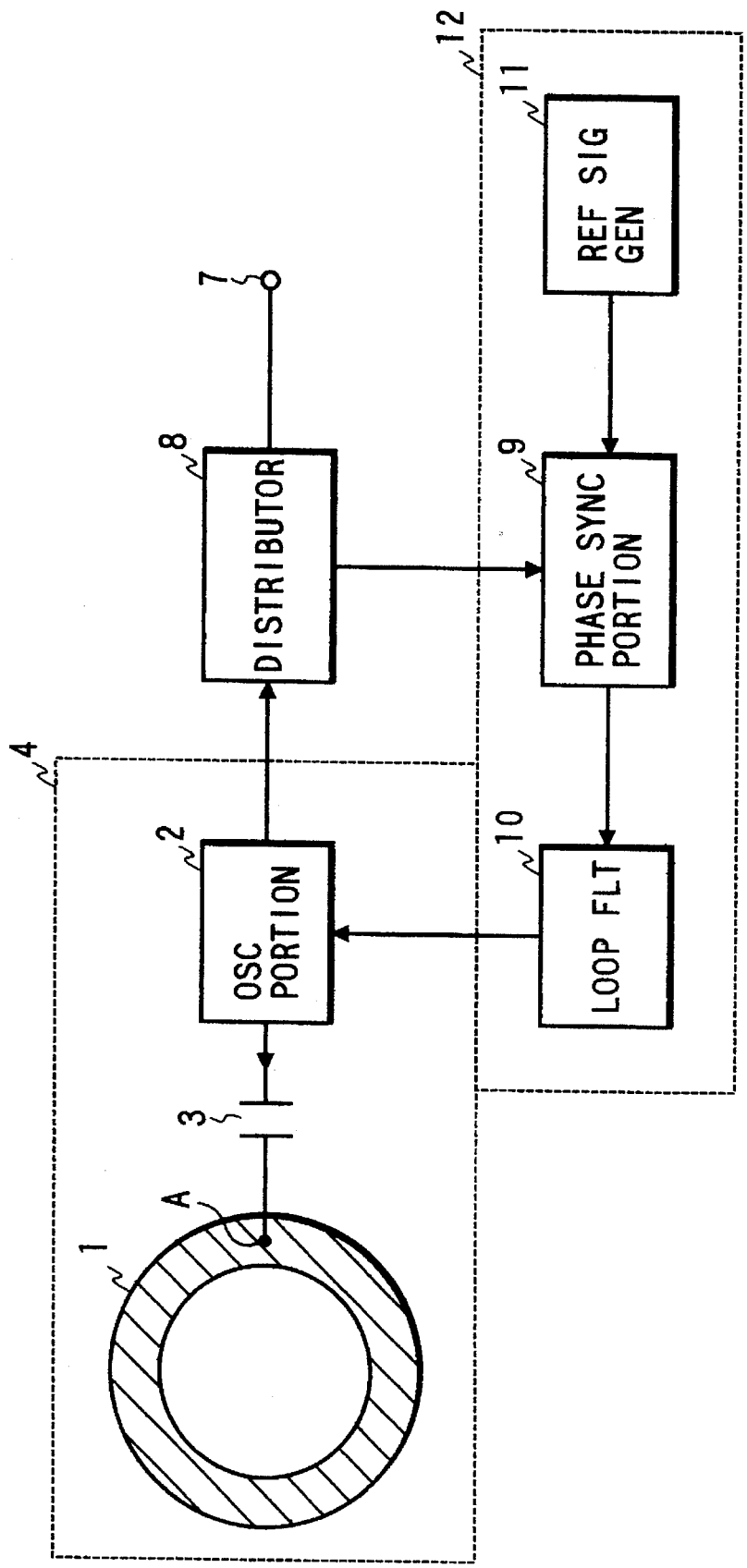
FIG. 21 is a block diagram of a prior art frequency synthesizer.

FIG. 19 is a schematic drawing of a frequency synthesizer of the sixteenth embodiment. The frequency synthesizer 105 of the sixteenth embodiment comprises a first oscillation portion 16 for generating a first oscillation frequency signal and resonating the ring resonator 1 (not shown in FIG. 19), a second oscillation portion 17 for generating a second oscillation frequency signal and resonating the ring resonator 1, a switch 18 for switching a supply power to either of the first or the second oscillation portion 16 or 17, a reference signal generator 11 for generating a reference signal, a phase synchronizing circuit 9 for generating a frequency control signal by comparing the first or the second oscillation frequency signal with the reference signal and supplying the frequency control signal to the oscillation portions 16 and 17 through the loop filter 10, a buffer amplifier 6C for receiving an oscillation frequency signal from the oscillation portion 16 through a coupling capacitor 5C, a buffer amplifier 6D receiving an oscillation frequency signal from the oscillation portion 17 through a coupling capacitor 5D, and a combining circuit 31 for combining the output of the buffer amplifiers 6C and 6D, wherein the first and second oscillation portions 16 and 17 have the same frequency sensitivity.

An operation of the frequency synthesizer 105 of the sixteenth embodiment will be described.

As described in the eleventh embodiment, in the time-division two way communication system used for the digital mobile unit communication system, the output frequency of the frequency synthesizer 105 is switched between transmission and receiving frequencies every time slot of transmission and receiving. Then, if the oscillation portions 16 and 17 cover frequency bands of transmission and receiving respectively and the frequency sensitivities to the control voltage are set to the same value, the control voltages are the same between the transmission and receiving operations.

Therefore, a transition response time of the phase synchronizing circuit due to a variation of the control voltage occurring on switching the frequency between the transmission and receiving operations can be reduced and a high speed frequency-lock can be realized.

Moreover, the external output is obtained from the ring resonator side and the input signal to the phase synchronizing circuit 9 is obtained from the oscillator side, so that the distributor which was generally connected to the oscillator output can be omitted.

As mentioned above, according to this embodiment, as shown in FIG. 19, the oscillation portions 16 and 17 have the same frequency sensitivities to the control voltage, so that the transition response time on switching the frequency can be reduced. Therefore, a superior high frequency band frequency synthesizer 105 showing a short frequency-lock interval with a simple structure is obtained.

Figure 23:
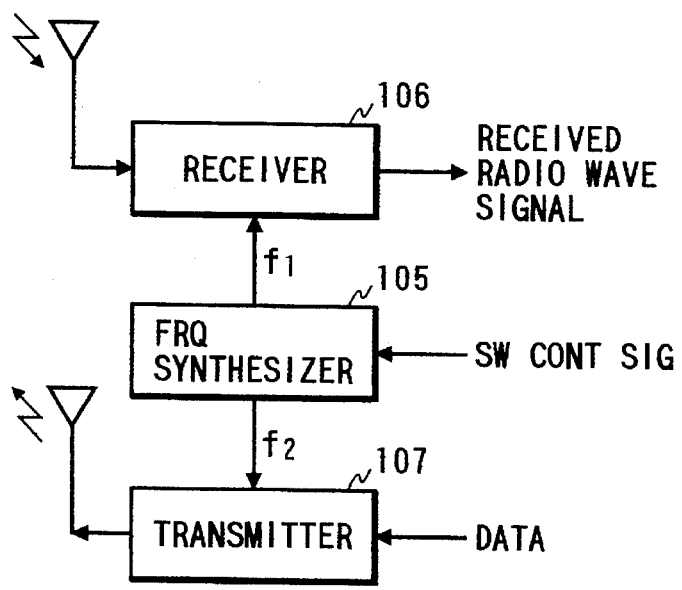
FIG. 23 is a block diagram of an example of a circuit using the frequency synthesizer of the sixteenth embodiment.

FIG. 23 is a block diagram of an example of a circuit using the frequency synthesizer 105 of the sixteenth embodiment. A radio wave signal is received by a receiver 106 using the oscillation signal having a frequency f1 from the frequency synthesizer 105 and outputs a received radio signal. In this condition, the frequency synthesizer is supplied with the switch control signal indicating that the supply power is supplied to the oscillation portion 16. Therefore, only the oscillation portion 16 oscillates and supplies the oscillation signal to the receiver 106 in this condition. In the transmission condition, the frequency synthesizer is supplied with the switch control signal indicating that the supply power is supplied to the oscillation portion 17. Therefore, only the oscillation portion 17 oscillates and supplies the oscillation signal to the transmitter 107 which transmits a radio signal.

As mentioned, according to this invention, a first oscillation circuit having a negative resistance active circuit is connected to a first point on the ring resonator through a first coupling capacitance, wherein respective points equidistantly divide the line length of the ring resonator into four, a second oscillation circuit having a negative resistance active circuit is connected to the second point on the ring resonator, which is apart from the first point by a quarter of the line length, through a second coupling capacitor, a grounding capacitor having a capacitance equivalent to that of the first oscillation circuit viewed from the first point is connected to a third point apart from the first point by a half of line length, and a grounding capacitor having capacitances equivalent to the capacitance of the second oscillation circuit viewed from the second point is connected to a fourth point apart from the second point by a half of the line length. Therefore, two independent high frequency band oscillators which do not affect each other can be realised. Moreover, at least a resonant capacitance is added between first and third points or between second and fourth points or at least a grounding capacitor is added between first and third or between second and fourth points, so that the resonator can be miniaturized and two small independent high frequency band oscillators which do not affect each other can be realized with one resonator and a frequency synthesizer showing a high speed locking using the oscillator can be realized with a simple structure.

What is claimed is:

1. An oscillator comprising:

a ring resonator;

an oscillation circuit having a negative resistance active circuit coupled to a first point on said ring resonator for oscillating at an oscillation frequency and resonating said resonator; and an output terminal, coupled to a second point on said ring resonator where a voltage is substantially zero with respect to said oscillation frequency when said ring resonator resonates, for outputting a second harmonic frequency signal.

2. An oscillator as claimed in claim 1, further comprising:

a second output terminal, coupled to a third point where a voltage is substantially zero with respect to said oscillation frequency when said ring resonator resonates, for outputting a second harmonic frequency signal which is in phase with said second harmonic frequency signal of said second point; and an in-phase combining circuit for combining said second harmonic frequency signals.

3. An oscillator as claimed in claim 1, further comprising:

a grounding capacitor for coupling a fourth point on said ring resonator to the ground, said fourth point being apart from said first point by a half of the line length of said ring resonator to the ground.

4. An oscillator as claimed in claim 3, wherein said grounding capacitor has a capacitance equivalent to a capacitance of said oscillation circuit viewed from said first point.

5. An oscillator as claimed in claim 1, further comprising:

a second output terminal, coupled to a third point where a voltage is substantially zero with respect to said oscillation frequency when said ring resonator resonates, for outputting a second harmonic frequency signal which is in phase with said second harmonic frequency signal of said second point;

a first grounding capacitor connected between said output terminal to the ground;

a second grounding capacitor connected between said second output terminal to the ground, said first capacitor having a capacitance which is substantially equal to a capacitance of said second capacitor; and an in-phase combining circuit for combining said second harmonic frequency signals.

6. An oscillator as claimed in claim 5, further comprising:

a resonant capacitor connected between said first point and a fourth point which is apart from said first point by a half of a line length of said ring resonator.

7. An oscillator as claimed in claim 5, further comprising at least an open-end transmission line connected to at least one of said first point and a fourth point which is apart from said first point by a half of a line length of said ring resonator.

8. An oscillator as claimed in claim 5, further comprising:

a third grounding capacitor connected between said first point and the ground; and a fourth grounding capacitor connected between a fourth point which is apart from said first point by a half of a line length of said ring resonator, said third and fourth grounding capacitor having substantially the same capacitance.

9. An oscillator as claimed in claim 5, further comprising;

a variable capacitor, having a variable capacitance, connected between said first point and a fourth point which is apart from said first point by a half of a line length of said ring resonator.

10. An oscillator as claimed in claim 5, further comprising:

a first variable capacitor connected between said first point and the ground; and a second variable capacitor connected between a fourth point and the ground, said fourth point being apart from said first point by a half of a line length of said ring resonator, said first and second variable capacitor having substantially the same voltage-capacitance characteristic.

11. An oscillator as claimed in claim 5, further comprising; a third grounding capacitor connected between a fourth point and the ground, said fourth point being apart from said first point by a half of a line length of said ring resonator and the ground.

12. An oscillator as claimed in claim 11, said third grounding capacitor has a capacitance which is substantially the same as a capacitance of said oscillation circuit viewed from said first point.

13. An oscillator comprising:

a ring resonator;

an oscillation circuit having a negative resistance active circuit coupled to a first point on said rink resonator for oscillating at an oscillation frequency and resonating said resonator; and first and second output terminals, coupled to second and third points which are apart from said first point by the same line length along said ring resonator and are apart from each other by an electrical length of 90° with respect to said oscillation frequency along said ring resonator, for outputting resonant frequency signals respectively.

14. An oscillator as claimed in claim 13, further comprising:

a resonant capacitor connected between said first point and a fourth point which is apart from said first point by a half of a line length of said ring resonator.

15. An oscillator as claimed in claim 13, further comprising at least an open-end transmission line connected to at least one of said first point and a fourth point which is apart from said first point by a half of a line length of said ring resonator.

16. An oscillator as claimed in claim 13, further comprising:

a first grounding capacitor connected between said first point and the ground; and a second grounding capacitor connected between a fourth point and the ground, said fourth point being apart from said first point by a half of a line length of said ring resonator, said first and second grounding capacitors having substantially the same capacitance.

17. An oscillator as claimed in claim 1, wherein said oscillation circuit has a control input for receiving a control signal and oscillates at said oscillation frequency controlled in accordance with said control signal.

18. An oscillator as claimed in claim 13, wherein said oscillation circuit has a control input for receiving a control signal and oscillates at said oscillation frequency controlled in accordance with said control signal.

19. An oscillator as claimed in claim 1, wherein said ring resonator shows a second harmonic component at said second point when said oscillation circuit resonates said ring resonator and said output terminal outputs said second harmonic component.

20. A frequency synthesizer comprising:

an oscillation portion having a ring resonator and an oscillation circuit including a negative resistance active circuit coupled to said ring resonator, said oscillation circuit being coupled to a first point of said resonator, resonating said ring resonator, and generating an oscillation signal of which frequency and phase are controlled in accordance with a control signal;

a phase synchronizing circuit for generating said control signal by comparing a reference signal with said oscillation signal; and an output terminal for supplying a second harmonic frequency signal from a second point on said ring resonator.

21. A frequency synthesizer as claimed in claim 20, wherein said second point on said ring resonator shows a voltage which is substantially zero with respect to said frequency of said oscillation signal when said ring resonator resonates.

22. A frequency synthesizer as claimed in claim 21, further comprising:

a second output terminal, coupled to a third point where a voltage is substantially zero with respect to said frequency of said oscillation signal when said ring resonator resonates, for outputting a second harmonic frequency signal which is in phase with said second harmonic frequency signal of said second point; and an in-phase combining circuit for combining said second harmonic frequency signals.

23. A frequency synthesizer as claimed in claim 21, further comprising:

a capacitor for coupling a fourth point on said ring resonator to the ground, said fourth point being apart from said first point by a half of the line length of said ring resonator to the ground.

24. A frequency synthesizer as claimed in claim 23, wherein said capacitor has a capacitance equivalent to a capacitance of said oscillation circuit viewed from said first point.

25. A frequency synthesizer as claimed in claim 21, further comprising:

a second output terminal, coupled to a third point where a voltage is substantially zero with respect to said frequency of said oscillation signal when said ring resonator resonates, for outputting a second harmonic frequency signal which is in phase with said second harmonic frequency signal of said second point;

first grounding capacitor connected between said output terminal to the ground;

second grounding capacitor connected between said second output terminal to the ground, said first capacitor having a capacitance which is substantially equal to a capacitance of said second capacitor; and an in-phase combining circuit for combining said second harmonic frequency signals.

26. A frequency synthesizer as claimed in claim 25, further comprising:

a resonant capacitor connected between said first point and a fourth point which is apart from said first point by a half of a line length of said ring resonator.

27. A frequency synthesizer as claimed in claim 25, further comprising at least an open-end transmission line connected to at least one of said first point and a fourth point which is apart from said first point by a half of a line length of said ring resonator.

28. A frequency synthesizer as claimed in claim 25, further comprising:

a third grounding capacitor connected between said first point and the ground; and a fourth grounding capacitor connected between a fourth point which is apart from said first point by a half of a line length of said ring resonator, said third and fourth grounding capacitor having substantially the same capacitance.

29. A frequency synthesizer as claimed in claim 25, further comprising;

a variable capacitor, having a variable capacitance, connected between said first point and a fourth point which is apart from said first point by a half of a line length of said ring resonator.

30. A frequency synthesizer as claimed in claim 25, further comprising:

a first variable capacitor connected between said first point and the ground; and a second variable capacitor connected between a fourth point and the ground, said fourth point being apart from said first point by a half of a line length of said ring resonator, said third and fourth grounding capacitors having variable capacitances and substantially the same voltage-capacitance characteristic.

31. A frequency synthesizer as claimed in claim 25, further comprising; a third grounding capacitor connected between a fourth point and the ground, said fourth point being apart from said first point by a half of a line length of said ring resonator.

32. A frequency synthesizer as claimed in claim 31, said third grounding capacitor has a capacitance which is substantially the same as a capacitance of said oscillation circuit viewed from said first point.

33. An oscillator comprising:

a ring resonator having a predetermined line length;

a first oscillation circuit having a first negative resistance active circuit coupled to a first point on said ring resonator for oscillating at a first oscillation frequency and resonating said resonator;

a second oscillation circuit having a second negative resistance active circuit coupled to a second point on said ring resonator which is apart from said first point by a quarter of said predetermined line length for oscillating at a second oscillation frequency which is different from said first oscillation frequency and for resonating said resonator;

a first grounding capacitor for coupling a third point on said ring resonator to the ground, said third point being apart from said first point by a half of said predetermined line length said first grounding capacitor having a first capacitance equivalent to a capacitance of said first oscillation circuit viewed from said first point;

a second grounding capacitor for coupling a fourth point on said ring resonator to the ground, said fourth point being apart from said second point by a half of said predetermined line length, said second grounding capacitor having a second capacitance equivalent to a capacitance of said second oscillation circuit viewed from said second point; and an outputting circuit for supplying first and second outputs from said third and fourth points respectively.

34. An oscillator as claimed in claim 33, further comprising a switch for switching a supply power to either of said first or second oscillation circuit in accordance with a control signal.

35. An oscillator as claimed in claim 33, wherein said outputting circuit comprises first and second buffer amplifiers for amplifying outputs from said third and fourth points respectively and a combining circuit for combining outputs of said first and second buffer amplifiers.

36. An oscillator as claimed in claim 33, further comprising at least a resonant capacitance provided to at east one of a first pair of said first and third points and a second pair of said second and fourth points.

37. An oscillator as claimed in claim 33, further comprising at least a pair of grounding capacitors, having substantially the same capacitance, for coupling to the ground, said at least a pair of grounding capacitors being provided to at least one of a first pair of said first and third points and a second pair of said second and fourth points respectively.

38. An oscillator as claimed in claim 33, further comprising at least a pair of variable capacitors, provided to at least one of a first pair of said first and third points and a second pair of said second and fourth points respectively, for coupling to the ground.

39. An oscillator as claimed in claim 38, wherein said pair of variable capacitors have substantially the same voltage-capacitance characteristic.

40. An oscillator as claimed in claim 33, wherein said first and second grounding capacitors comprise transmission lines respectively.

41. An oscillator as claimed in claim 37, wherein said at least a pair of grounding capacitors comprise transmission lines respectively.

42. An oscillator as claimed in claim 33, wherein said first oscillation frequency is higher than said second oscillation frequency.

43. A communication apparatus for transmitting a first radio signal and receiving a second radio signal, comprising:

an oscillator having:

a ring resonator having a predetermined line length;

a first oscillation circuit having a first negative resistance active circuit coupled to a first point on said ring resonator for oscillating at a first oscillation frequency and resonating said resonator;

a second oscillation circuit having a second negative resistance active circuit coupled to a second point on said ring resonator which is apart from said first point by a quarter of said predetermined line length for oscillating at a second oscillation frequency which is different from said first oscillation frequency and for resonating said resonator;

a first grounding capacitor for coupling a third point on said ring resonator to the ground, said third point being apart from said first point by a half of said predetermined line length, said first grounding capacitor having a first capacitance equivalent to a capacitance of said first oscillation circuit viewed from said first point;

a second grounding capacitor for coupling a fourth point on said ring resonator to the ground, said fourth point being apart from said second point by a half of said predetermined line length, said second grounding capacitor having a second capacitance equivalent to a capacitance of said second oscillation circuit viewed from said second point;

a switch for switching a supply power to either of said first or second oscillation circuit in accordance with a control signal; and an outputting circuit for supplying first and second outputs from said third and fourth points respectively;

transmission means for transmitting said first radio signal using said first output as a carrier signal and supplying said control signal to said switch to supply said supply power to said first oscillation circuit; and receiving means for receiving said second radio signal using said second output to detect said second radio signal and supplying said control signal to said switch to supply said supply power to said second oscillation circuit.

44. A communication apparatus for receiving a radio signal, comprising:

an oscillator having:

a ring resonator having a predetermined line length;

a first oscillation circuit having a first negative resistance active circuit coupled to a first point on said ring resonator for oscillating at a first oscillation frequency and resonating said resonator;

a second oscillation circuit having a second negative resistance active circuit coupled to a second point on said ring resonator which is apart from said first point by a quarter of said predetermined line length for oscillating at a second oscillation frequency which is different from said first oscillation frequency and for resonating said resonator;

a first grounding capacitor for coupling a third point on said ring resonator to the ground, said third point being apart from said first point by a half of said predetermined line length, said first grounding capacitor having a first capacitance equivalent to a capacitance of said first oscillation circuit viewed from said first point;

a second grounding capacitor for coupling a fourth point on said ring resonator to the ground, said fourth point being apart from said second point by a half of said predetermined line length, said second grounding capacitor having a second capacitance equivalent to a capacitance of said second oscillation circuit viewed from said second point; and an outputting circuit for supplying first and second outputs from said third and fourth points respectively;

receiving means for receiving said radio signal;

a first frequency converting circuit for converting said radio signal from said receiving means using said first output;

a second frequency converting circuit for converting an output of said first frequency converting circuit using said second output; and a detector for detecting said radio signal using an output of said second frequency converting circuit.

45. A frequency synthesizer comprising:

an oscillator having:

a ring resonator having a predetermined line length;

a first oscillation circuit having a first negative resistance active circuit coupled to a first point on said ring resonator for resonating said resonator and oscillating at a first oscillation frequency controlled in accordance with a first control signal in a first mode;

a second oscillation circuit having a second negative resistance active circuit coupled to a second point on said ring resonator which is apart from said first point by a quarter of said predetermined line length for resonating said resonator and oscillating at a second oscillation frequency controlled in accordance with a second control signal in a second mode;

a first grounding capacitor for coupling a third point on said ring resonator to the ground, said third point being apart from said first point by a half of said predetermined line length, said first grounding capacitor having a first capacitance equivalent to a capacitance of said first oscillation circuit viewed from said first point;

a second grounding capacitor for coupling a fourth point on said ring resonator to the ground, said fourth point being apart from said second point by a half of said predetermined line length, said second grounding capacitor having a second capacitance equivalent to a capacitance of said second oscillation circuit viewed from said second point;

a switch for supplying a supply power to said first oscillation circuit in said first mode and to said second oscillation circuit in said second mode; and a phase synchronizing circuit for generating said first control signal by comparing a reference signal with said oscillation signal in said first mode and for generating said second control signal by comparing a reference signal with said oscillation signal in said second mode; and an outputting circuit for supplying first and second outputs from said third and fourth points respectively.

46. A frequency synthesizer as claimed in claim 45, wherein said first and second oscillation circuits have substantially the same frequency sensitivity such that the same change in said first and second control signals causes the same variation in said first and second oscillation frequencies.

* * * * *